(12) United States Patent
Furutani et al.

(10) Patent No.: US 8,750,023 B2
(45) Date of Patent: Jun. 10, 2014

(54) SEMICONDUCTOR MEMORY DEVICE

(75) Inventors: Kazuma Furutani, Kanagawa (JP); Yutaka Shionoiri, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 268 days.

(21) Appl. No.: 13/230,122

(22) Filed: Sep. 12, 2011

(65) Prior Publication Data

US 2012/0063206 A1    Mar. 15, 2012

(30) Foreign Application Priority Data

Sep. 13, 2010   (JP) ................................ 2010-204405

(51) Int. Cl.
*G11C 11/24*      (2006.01)

(52) U.S. Cl.
USPC .......................................................... 365/149

(58) Field of Classification Search
USPC .......................................................... 365/149
See application file for complete search history.

(56) References Cited

U.S. PATENT DOCUMENTS

| | | | |
|---|---|---|---|
| 5,465,235 A * | 11/1995 | Miyamoto | 365/185.25 |
| 5,731,856 A | 3/1998 | Kim et al. | |
| 5,740,097 A * | 4/1998 | Satoh | 365/49.15 |
| 5,744,864 A | 4/1998 | Cillessen et al. | |
| 5,761,700 A * | 6/1998 | Cozart et al. | 711/102 |
| RE36,732 E | 6/2000 | Miyamoto | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Cociety of Applied Physics.

(Continued)

*Primary Examiner* — Huan Hoang
*Assistant Examiner* — Pablo Huerta
(74) *Attorney, Agent, or Firm* — Fish & Richardson P.C.

(57) ABSTRACT

An object is to provide a semiconductor memory device capable of copying memory data without using an external circuit. The semiconductor memory device includes a bit line to which first terminals of a plurality of memory cells are connected in common; a pre-charge circuit which is connected to the bit line and pre-charges the bit line with a specific potential in data reading; a data holding circuit comprising a capacitor which temporarily holds data read out from the memory cell or data which is written to the memory cell; and an inverted data output circuit which outputs inverted data of data held in the data holding circuit to the bit line. The inverted data output circuit includes a means for controlling output of inverted data of data held in the data holding circuit.

22 Claims, 20 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,688,648 B2 * | 3/2010 | Kim ................ 365/189.14 |
| 7,732,819 B2 | 6/2010 | Akimoto et al. |
| 7,929,332 B2 | 4/2011 | Fujita |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0205880 A1 | 9/2005 | Anzai et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0187710 A1 * | 8/2006 | Son ................ 365/185.09 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0121878 A1 * | 5/2011 | Kato et al. ................ 327/215 |
| 2011/0156024 A1 * | 6/2011 | Koyama et al. ............ 257/43 |
| 2011/0258395 A1 * | 10/2011 | Chan et al. ................ 711/142 |
| 2012/0182788 A1 * | 7/2012 | Kurokawa ................ 365/149 |
| 2012/0250407 A1 * | 10/2012 | Kurokawa ................ 365/182 |
| 2012/0320689 A1 * | 12/2012 | Kuang et al. ............ 365/189.08 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-122092 A | 5/1995 |
| JP | 08-264794 A | 10/1996 |
| JP | 11-505377 A | 5/1999 |
| JP | 2922116 B2 | 7/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English Translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center, with English translation.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

* cited by examiner 117
116

117
116

SEMICONDUCTOR MEMORY DEVICE

BACKGROUND OF THE INVENTION

1. Field of the Invention

The present invention relates to a semiconductor device, a semiconductor memory device, and a peripheral circuit thereof. In addition, the present invention relates to a method for driving a semiconductor memory device.

2. Description of the Related Art

In recent years, the demand for a non-volatile semiconductor memory device has been significantly increased because it has advantages in that, for example, data is not erased even when the power is turned off. In a flash memory which is a non-volatile semiconductor memory device capable of electrically erasing data at once, one memory cell can be formed using one transistor; thus, the capacity of a memory can be increased. Such a flash memory is expected to be used instead of a magnetic disk or the like.

In the above non-volatile semiconductor memory device, memory cells including MOS transistors having floating gates are arranged in matrix to form a memory cell array. Charge is accumulated in the floating gate so that the threshold value of the MOS transistor is changed. This change of threshold value is stored as data. When charge is accumulated in the floating gate, a high electric field is formed between a word line and a well formed in a substrate; thus, current which penetrates an insulating film flows from the well. As a result, charge is accumulated in the floating gate.

In general, a memory cell unit is connected to an external circuit through a signal line, and a sense amplifier latch circuit is provided therebetween. Patent Document 1 and the like disclose an example of such a structure. FIG. 19 illustrates a circuit configuration of a conventional non-volatile semiconductor memory device. The circuit in FIG. 19 includes a flip-flop circuit (FF circuit) 203. The FF circuit 203 includes a clocked inverter circuit 201 and a clocked inverter circuit 202 which are controlled by clock signals CK and CKB (inverted signal of CK), and thus has a function of holding temporarily writing data and reading data. In addition, the circuit in FIG. 19 includes a pre-charge transistor 215 which is formed using a p-channel transistor and is turned on when pre-charge operation is performed and is turned off when pre-charge operation is not performed in reading data of a memory cell. The circuit in FIG. 19 also includes a transmission circuit 213 which is connected to a bit line 214 and a node 204 on the bit line 214 side of the FF circuit 203; and a column gate 206 which is connected to a node 205 on the side opposite to the bit line side of the FF circuit 203, a data signal line 207, and a data inversion signal line 208 and which is controlled by a column control signal line 209. A memory cell unit 210 and a memory cell unit 211 are connected to the bit line 214. There is no particular limitation on the number of memory cell units in the memory cell unit 212 connected to the bit line 214. Note that only the memory cell unit connected to one bit line is illustrated in this drawing for the sake of simplicity; however, in a non-volatile semiconductor memory device which is actually used, memory cells are arrayed, and the number of circuits an example of which is illustrated in FIG. 19 corresponds to the number of bit lines.

In the circuit configuration of FIG. 19, in data writing, data is transmitted from the signal line through the column gate 206, and held temporarily in the FF circuit 203. Then, the held data is transmitted through the bit line to be written to the memory cell. In some cases, data "1" is stored in the memory cell when a high potential is applied to the bit line and data "0" is stored in the memory cell when a low potential is applied to the bit line. In data reading, data of the memory cell is temporarily held in the FF circuit 203, and the held data is transmitted through the column gate 206 to an external circuit through a signal line. In such a manner, data is read out. In some cases, the bit line has a high potential when data "0" is stored in the memory cell and the bit line has a low potential when data "1" is stored in the memory cell. That is, the potential of the bit line in data reading and that in data writing are inverted from each other. Note that the potential level set in data reading and that set in data writing are different from each other in some cases.

On the other hand, a technique in which a transistor is manufactured using an oxide semiconductor as a semiconductor material and applied to an electronic device or an optical device has attracted attention. For example, a technique in which a transistor is manufactured using zinc oxide or an In—Ga—Zn—O-based compound as a semiconductor material and used as a switching element or the like of an image display device has attracted attention.

Transistors which are manufactured using such an oxide semiconductor over a glass substrate, a plastic substrate, or the like are expected to be applied to display devices and electronic devices such as a liquid crystal display, an electroluminescent display (also referred to as an EL display), and electronic paper (see Non-Patent Document 1).

REFERENCE

Patent Document

[Patent Document 1] Japanese Published Patent Application No. H7-122092

Non-Patent Document

[Non-Patent Document 1] Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633

SUMMARY OF THE INVENTION

Some applications need to copy data stored in one memory region to another memory region. In a conventional circuit configuration, when data held in one memory in a sense amplifier latch circuit is written to another memory without any action, inverted data is written. Therefore, in a conventional circuit configuration, the following process is needed: data is copied to an external device and inverted, then held in a sense amplifier latch circuit, and written. For this reason, a device for inverting data needs to be provided as an external device. In addition, there is a problem in that it takes an enormous amount of time to read out data from a memory circuit, transfer it to an external circuit, invert it, and perform writing operation. In the case where data is copied per page (this process is referred to as copy back), it takes a further amount of time.

An object of one embodiment of the present invention is to provide a non-volatile semiconductor memory device capable of copying memory data without using an external circuit. Another object of one embodiment of the present invention is to provide a non-volatile semiconductor memory device which realizes a significant reduction in loss of operation time in copying memory data. Another object of one embodiment of the present invention is to provide a non-volatile semiconductor memory device which copies memory data at once per page. Another object of one embodiment of the present invention is to provide a non-volatile semiconductor memory device with low power consumption. Another object of one embodiment of the present invention is to provide a non-volatile semiconductor memory device with a small circuit area. Note that the descriptions of these objects do not preclude the existence of other objects. Note that one embodiment of the present invention does not necessarily achieve all the objects listed above. Other objects will be apparent from and can be derived from the description of the specification, the drawings, the claims, and the like.

One embodiment of the present invention is a semiconductor memory device including a memory cell; a bit line connected to a first terminal of the memory cell; a pre-charge circuit which is connected to the bit line and pre-charges the bit line with a predetermined potential in data reading; a data holding circuit including a capacitor which temporarily holds data read out from the memory cell or data which is written to the memory cell; and an inverted data output circuit which outputs inverted data of data held in the data holding circuit to the bit line. The data holding circuit holds data in a node connected to a transistor and the capacitor. The inverted data output circuit includes a means for controlling output of inverted data of data held in the data holding circuit.

In the above, the transistor includes an oxide semiconductor.

One embodiment of the present invention is a semiconductor memory device including a memory cell; a bit line connected to a first terminal of the memory cell; a first transistor; a second transistor; a capacitor; and an inverted data output circuit which outputs inverted data of data held in the capacitor to the bit line. A first terminal of the first transistor is connected to a first power supply line and a second terminal of the first transistor is connected to the bit line. A first terminal of the second transistor is connected to the bit line and a second terminal of the second transistor is connected to a first terminal of the capacitor. A second terminal of the capacitor is connected to a second power supply line. The inverted data output circuit includes a means for controlling output of inverted data of data held in the capacitor.

One embodiment of the present invention is a semiconductor memory device including a memory cell; a bit line connected to a first terminal of the memory cell; a first transistor; a second transistor; a third transistor; a capacitor; and an inverted data output circuit which outputs inverted data of data held in the capacitor to a bit line. A first terminal of the first transistor is connected to a first power supply line and a second terminal of the first transistor is connected to the bit line. A first terminal of the third transistor is connected to the bit line and a second terminal of the third transistor is connected to a first terminal of the second transistor. A second terminal of the second transistor is connected to a first terminal of the capacitor. A second terminal of the capacitor is connected to a second power supply line. The inverted data output circuit includes a means for controlling output of inverted data of data held in the capacitor.

In the above, the second transistor includes an oxide semiconductor.

In the above, the semiconductor memory device includes a reset circuit which resets the capacitor so that the capacitor has a predetermined potential.

In the above, the reset circuit includes a fourth transistor including an oxide semiconductor.

According to one embodiment of the present invention, a semiconductor memory device capable of copying memory data without using an external circuit can be provided. According to another embodiment of the present invention, a semiconductor memory device which realizes a significant reduction in loss of operation time in copying memory data can be provided. According to another embodiment of the present invention, a semiconductor memory device which copies memory data at once per page can be provided. According to another embodiment of the present invention, a semiconductor memory device with low power consumption can be provided. According to another embodiment of the present invention, a semiconductor memory device with a small circuit area can be provided.

BRIEF DESCRIPTION OF THE DRAWINGS

FIGS. 6A-1, 6A-2, and 6B are circuit diagrams of semiconductor memory devices.

DETAILED DESCRIPTION OF THE INVENTION

Figure 1:
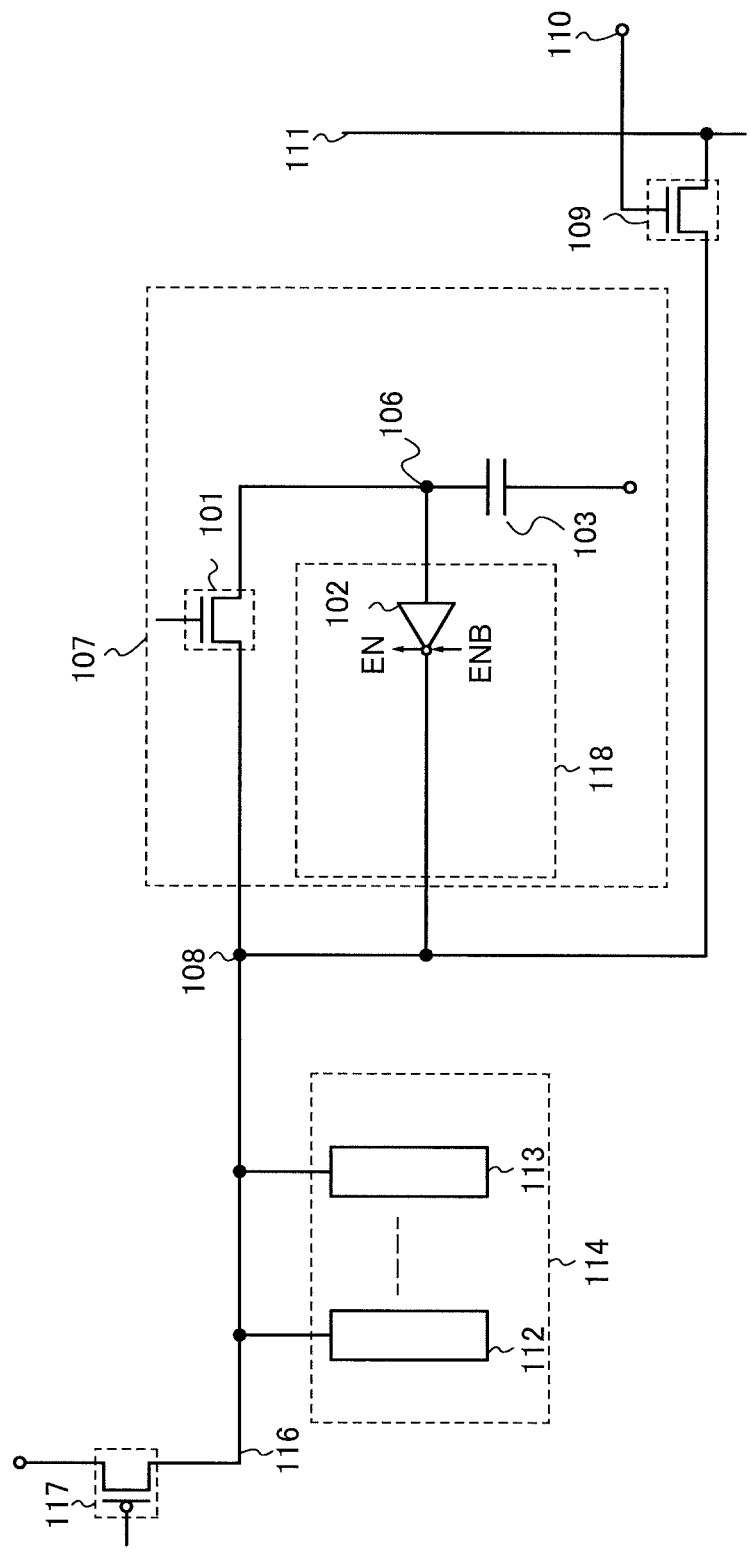
FIG. 1 is one example of a circuit diagram of a semiconductor memory device.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention is not construed as being limited to description of the embodiments. Note that, in the drawings hereinafter shown, the same portions or portions having similar functions are denoted by the same reference numerals, and repeated description thereof will be omitted. Note that what is described (or part thereof) in one embodiment can be applied to, combined with, or exchanged with another content in the same embodiment and/or what is described (or part thereof) in another embodiment or other embodiments. Note that in each embodiment, a content described in the embodiment is a content described with reference to a variety of diagrams or a content described with texts described in this specification. In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Note that two electrodes serving as a source and a drain are included in one transistor; in the present invention, which of them serves as the source (or the drain) is determined depending on a potential difference between these electrodes. Therefore, it is difficult to define which is the source (or the drain). For this reason, in this specification, two electrodes serving as a source and a drain are referred to as a first terminal and a second terminal, a first electrode and a second electrode, or a first region and a second region in some cases.

A plurality of transistors which have the same polarity and are connected in series and whose gates are connected to each other are referred to as a multi-gate transistor. In the present invention, a multi-gate transistor is regarded as functioning as one transistor, and two electrodes at both ends of the multi-gate transistor are referred to as a first terminal and a second terminal, a first electrode and a second electrode, or a first region and a second region in some cases. That is, a transistor described in the present invention may be either one transistor or a multi-gate transistor.

At least two different levels of potential are needed for circuit operation in some cases. In this specification, for example, a high-potential power supply is referred to as VDD and a low-potential power supply is referred to as VSS. Further, a high-potential level is referred to as H, an H signal, an H potential, an H voltage, or an H level, and a low-potential level is referred to as L, an L signal, an L potential, an L voltage, or an L level in some cases. In this specification, the two different levels of potential are used for description of circuit operation; however, three or more different levels of potential may be used for circuit operation. Further, a high-potential level in one circuit is different from a high-potential level in another circuit. The same applies to a low-potential level. In addition, a high-potential level in one operation is different from a high-potential level in another operation. The same applies to a low-potential level.

Note that in this specification and the like, when it is explicitly described that X and Y are connected, the case where X and Y are electrically connected, the case where X and Y are functionally connected, and the case where X and Y are directly connected are included therein. Here, each of X and Y denotes an object (e.g., a device, an element, a circuit, a wiring, an electrode, a terminal, a conductive film, or a layer). Therefore, another element may be provided between elements having a connection relation shown in drawings and texts, without limitation to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, and/or a diode) can be connected between X and Y.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, when a signal output from X is transmitted to Y, it can be said that X and Y are functionally connected even if another circuit is provided between X and Y.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

Embodiment 1

A circuit configuration according to one embodiment of the present invention will be described with reference to FIG. 1.

Illustrated in FIG. 1 are a data holding circuit 107 including a transistor 101, a three-state inverter circuit 102 serving as an inverted data output circuit 118, and a capacitor 103; a pre-charge transistor 117; a bit line 116; a memory cell unit 112; and a memory cell unit 113. In addition, a column gate 109, a column gate control line 110, and a data signal line 111 are illustrated. In addition, a node 106 and a node 108 are illustrated.

The transistor 101 transmits and holds data which is transmitted through the column gate 109 from the data signal line 111 to be written to the memory cell and data which is transmitted from the memory cell to the node 106 to be read out. The transistor 101 is illustrated as an n-channel transistor in FIG. 1; however, it may be a p-channel transistor.

Charge is accumulated in the capacitor 103. Here, the capacitance value of the capacitor 103 is defined as C11, and the gate capacitance value of the transistor 101 is defined as C21. In the case where the relation C11<C21 is satisfied, when the transistor 101 is turned on so that charge is accumulated in the capacitor 103 and then the transistor 101 is turned off after charging is completed, there is a possibility that the potential of the node 106 is significantly reduced since charge in the capacitor 103 is affected by the gate capacitance of the transistor 101. Therefore, the relation C11>C21 is preferably satisfied. One end of the capacitor 103 is preferably connected to a power supply line to which a constant potential is supplied.

The three-state inverter circuit 102 serving as the inverted data output circuit 118 outputs inverted data of data held in the node 106 to the node 108. Here, the "three-state inverter circuit" means an inverter circuit capable of controlling activation and non-activation by inputting a control signal EN and an inverted control signal ENB which is an inverted signal of the control signal EN. The three-state inverter circuit 102 outputs inverted data in an active state, and does not output data in a non-active state because it is in a high impedance state.

Figure 2:
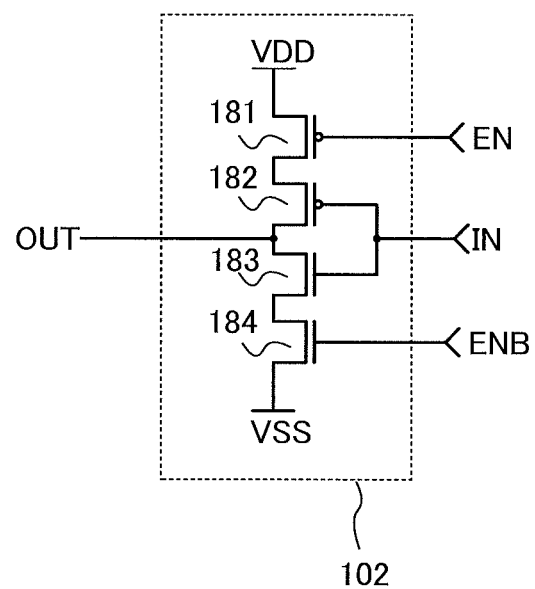
FIG. 2 illustrates one example of a three-state inverter circuit.

One example of a circuit configuration of the three-state inverter circuit 102 is illustrated in FIG. 2. A p-channel transistor 181, a p-channel transistor 182, an n-channel transistor 183, and an n-channel transistor 184 are connected in series. A first terminal of the p-channel transistor 181 is connected to a wiring which supplies a high potential VDD, and a second terminal of the n-channel transistor 184 is connected to a wiring which supplies a low potential VSS. An input signal IN is input to a gate of the p-channel transistor 182 and a gate of the n-channel transistor 183. A second terminal of the p-channel transistor 182 and a first terminal of the n-channel transistor 183 serve as output terminals. The control signal EN is input to a gate of the p-channel transistor 181, and the inverted control signal ENB is input to a gate of the n-channel transistor 184. When an L signal is input as the control signal EN (when an H signal is input as the inverted signal ENB), the three-state inverter circuit 102 is brought into an active state, so that inverted data is output. When the H signal is input as the control signal EN (when the L signal is input as the inverted control signal ENB), the three-state inverter circuit 102 is brought into a non-active state, so that data is not output.

The three-state inverter circuit 102 controls whether to transmit output data of the data holding circuit 107 to the memory cell unit 114 or to the data signal line 111 by the control signal EN. The high potential VDD set in writing operation and that set in reading operation may have different levels of potential. Similarly, the low potential VSS set in writing operation and that set in reading operation may be different from each other.

There is no particular limitation on the number of memory cell units in the memory cell unit 114 connected to the bit line. The memory cell unit 114 may have either a NAND-type memory cell structure or a NOR-type memory cell structure. Further, there is no particular limitation on the circuit configuration as long as a semiconductor memory device is formed.

The pre-charge transistor 117 has a function of charging the bit line 116 with a predetermined potential. For example, the pre-charge transistor 117 is used for pre-charge or the like before data is read out from the memory cell. The pre-charge transistor 117 is illustrated as a p-channel transistor in FIG. 1; however, it may be an n-channel transistor.

Figure 19:
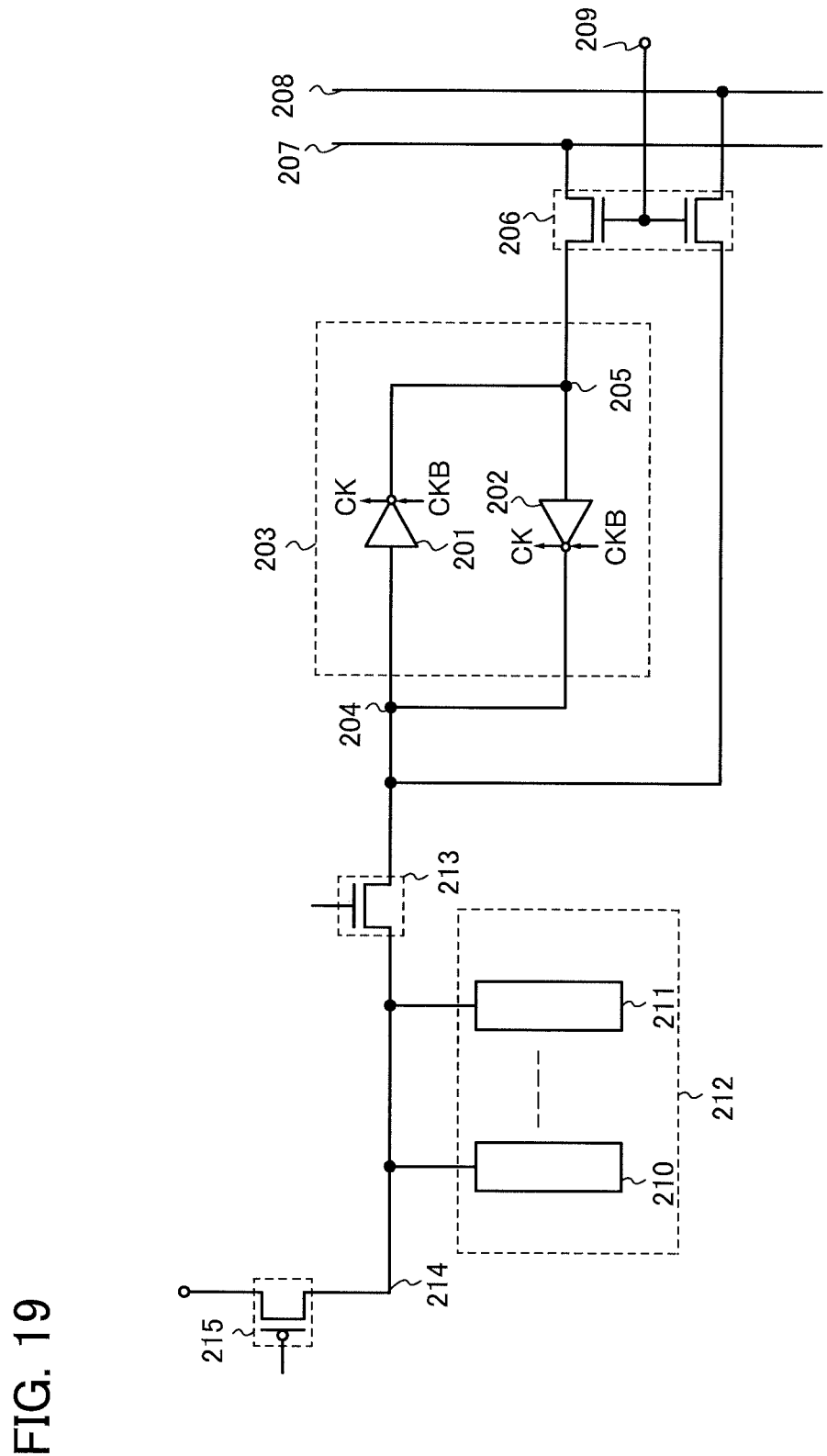
FIG. 19 is a conventional example of a circuit diagram of a semiconductor memory device.

In the conventional circuit diagram illustrated in FIG. 19, the data signal line 207 and the data inversion signal line 208 are connected to an input terminal and an output terminal of the FF circuit 203, so that data of the two terminals of the FF circuit 203 is prevented from being unstable in an initial state. In this embodiment, the data holding circuit 107 is used instead of the FF circuit 203, so that one data signal line can be omitted.

The data signal line 111 is connected to the node 108 through the column gate 109. The on/off of the column gate 109 is controlled by the column gate control line 110. The column gate 109 is illustrated as an n-channel transistor in FIG. 1; however, it may be a p-channel transistor.

In data writing, data is transmitted from the data signal line 111 through the column gate 109, and held temporarily in the data holding circuit 107. Then, the held data is output from the inverted data output circuit 118 to be transmitted to the bit line. In such a manner, data is written to the memory cell. In some cases, data "1" is stored in the memory cell when a high potential is applied to the bit line and data "0" is stored in the memory cell when a low potential is applied to the bit line. In data reading, data of the memory cell is held temporarily in the data holding circuit 107, and the held data is output from the inverted data output circuit 118. Then, it is transmitted from the data signal line 111 to an external circuit through the column gate 109. In such a manner, data is read out. In some cases, the potential of the bit line is high when data "0" is stored in the memory cell, and the potential of the bit line is low when data "1" is stored in the memory cell. That is, the potential of the bit line in data reading and that in data writing are inverted from each other. Note that the potential level set in data reading and that set in data writing are different from each other in some cases.

With the structure in this embodiment, it is possible to hold data read from the memory cell unit in the data holding circuit 107 and output the inverted data to the bit line 116. Therefore, in writing data to another memory cell, data which is not inverted can be written without transferring data to an external circuit. Since data is not transferred to an external circuit, the time required for copying data can be shortened. In addition, since an external circuit is not used, power consumption can be reduced.

Note that in this specification and the like, it might be possible for those skilled in the art to constitute one embodiment of the invention even when portions to which all terminals of an active element (e.g., a transistor or a diode), a passive element (e.g., a capacitor or a resistor), or the like are connected are not specified. In particular, in the case where the number of portions to which the terminal is connected is plural, it is not necessary to specify the portions to which the terminal is connected. Therefore, in some cases, it is possible to constitute one embodiment of the invention by only specifying portions to which only some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Moreover, it might be possible for those skilled in the art to specify the invention when at least the function of a circuit is specified. Thus, when the connection portion of a circuit is specified, the circuit is disclosed as one embodiment of the invention even when the function of the circuit is not specified, and one embodiment of the invention can be constituted. Moreover, when the function of a circuit is specified, the circuit is disclosed as one embodiment of the invention even when the connection portion of the circuit is not specified, and one embodiment of the invention can be constituted.

Embodiment 2

Circuit configurations according to one embodiment of the present invention, which are different from the circuit configuration in Embodiment 1, will be described with reference to FIG. 3, FIG. 4, and FIGS. 5A and 5B.

Figure 3:
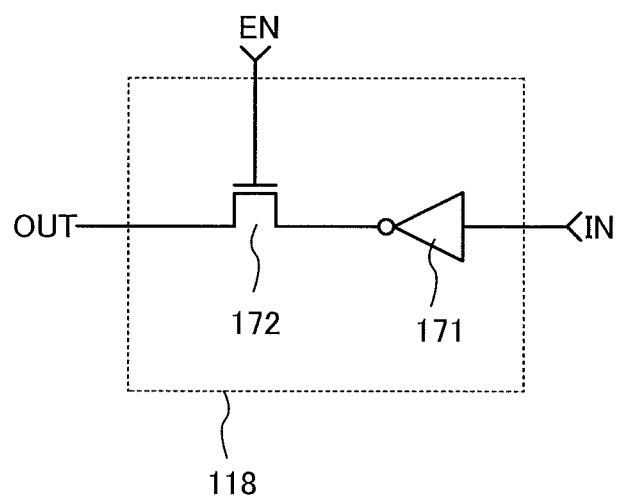
FIG. 3 illustrates one example of an inverted data output circuit.

As the inverted data output circuit 118, an inverter 171 and a transistor 172 may be used as illustrated in FIG. 3 instead of the three-state inverter circuit 102. The transistor 172 is illustrated as an n-channel transistor in FIG. 3; however, it may be a p-channel transistor. The transistor 172 is preferably disposed on the output side of the inverter 171. It is possible to control whether to output an inverted signal of a signal of the node 106 to the node 108 by controlling the transistor 172. In the three-state inverter circuit 102, the control signal EN and the inverted control signal ENB are used; however, only one signal is needed to control the transistor 172. Therefore, a reduction in circuit size and power consumption is possible.

Figure 4:
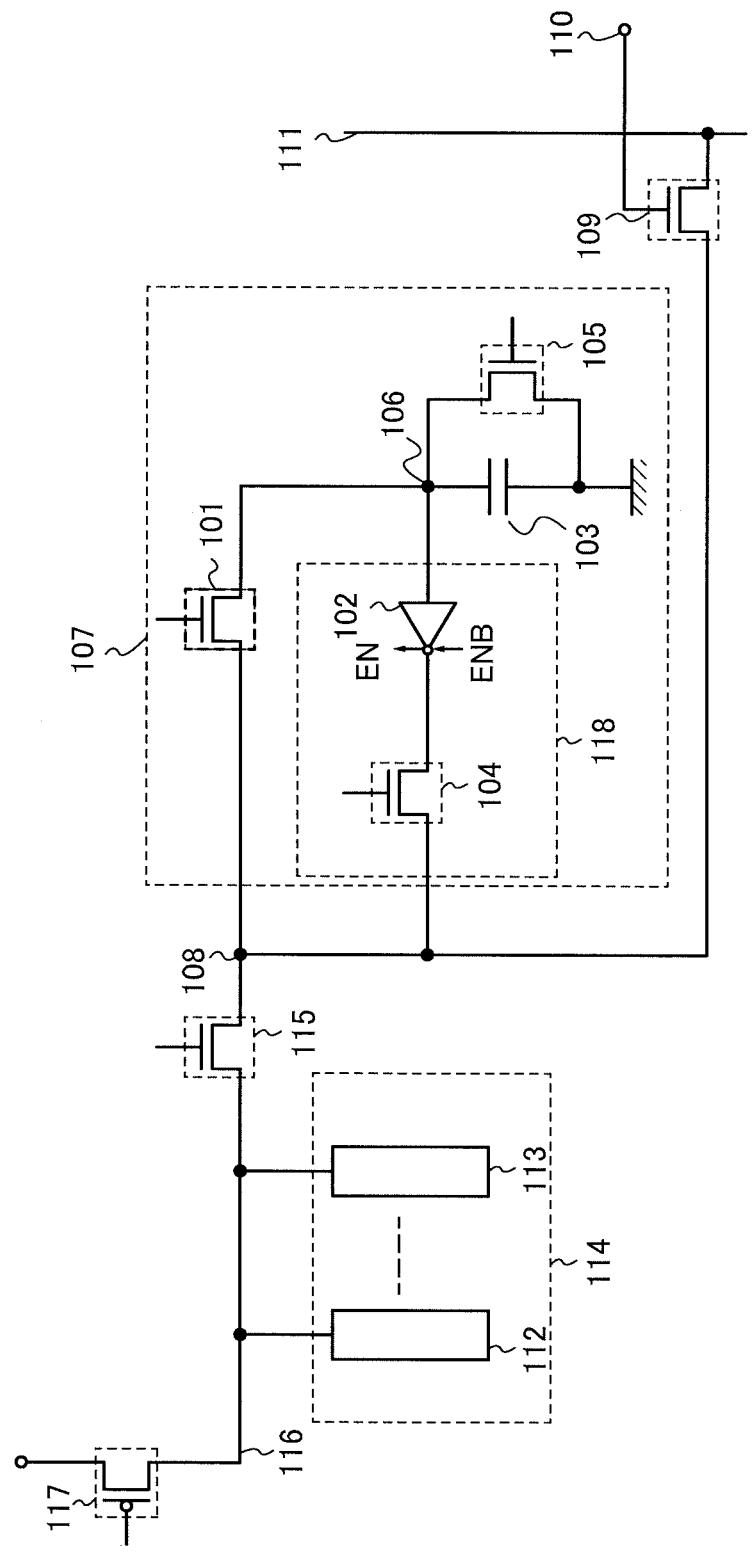
FIG. 4 is one example of a circuit diagram of a semiconductor memory device.

As illustrated in FIG. 4, as part of the inverted data output circuit 118, a transistor 104 may be connected to an output terminal of the three-state inverter circuit 102. The transistor 104 controls whether to transmit output data of the data holding circuit 107 to the memory cell or the data signal line 111.

As illustrated in FIG. 4, the data holding circuit 107 may include a reset circuit. For example, as the reset circuit, a transistor 105 has a function of performing reset operation so that the node 106 has a predetermined potential. The transistor 105 is illustrated as an n-channel transistor in FIG. 4; however, it may be a p-channel transistor. In FIG. 4, a first terminal of the capacitor 103 is connected to the node 106, and a second terminal thereof is connected to a low-potential power supply; however, the second terminal may be connected to a high-potential power supply. In addition, a first terminal of the transistor 105 is connected to the node 106, and a second terminal thereof is connected to the low-potential power supply in FIG. 4; however, the second terminal may be connected to the high-potential power supply. Reset operation is performed before data is taken to the node 106 of the data holding circuit, whereby stable operation can be performed anytime.

As illustrated in FIG. 4, a transmission circuit may be provided between the bit line 116 and the node 108. For example, a transmission circuit 115 can be formed using an n-channel transistor. The transmission circuit 115 can control electrical conduction and non-electrical conduction between the bit line 116 and the node 108. By the transmission circuit 115, operation of a memory cell array and operation of a sense amplifier latch circuit can be individually performed; thus, operation time can be shortened. The transmission circuit 115 is illustrated as an n-channel transistor in FIG. 4; however, it may be a p-channel transistor.

Figure 5A:
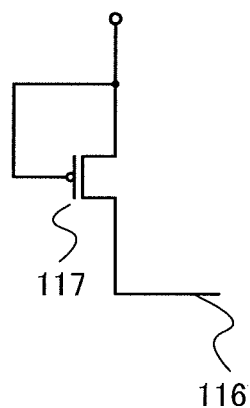
FIGS. 5A and 5B each illustrate one example of a pre-charge circuit.
Figure 5B:
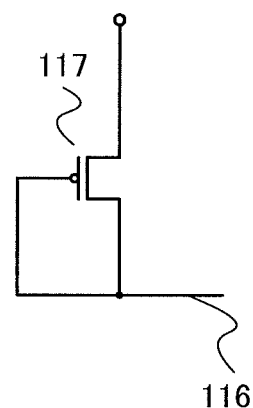

The pre-charge transistor 117 may be connected as illustrated in FIG. 5A or FIG. 5B. With the connection illustrated in FIG. 5A or FIG. 5B, a signal for controlling the pre-charge transistor 117 is unnecessary. A reduction in circuit size and power consumption can be realized. The pre-charge transistor 117 is illustrated as an n-channel transistor in FIGS. 5A and 5B; however, it may be a p-channel transistor.

Note that in FIG. 1 and FIG. 4, the transistor 101, the transistor 104, and the transistor 105 are formed as transistors including an oxide semiconductor which are described later; thus, off-state leakage of the transistors is small, so that the potential of the node 106 can be easily held.

Embodiment 3

A memory cell unit that can be used for one embodiment of the present invention will be described.

A memory element included in a memory cell unit can be formed in a non-volatile semiconductor memory device. In a general non-volatile semiconductor memory device, memory cells including MOS transistors having floating gates are arranged in matrix to form a memory cell array. Charge is accumulated in the floating gate so that the threshold value of the MOS transistor is changed. This change of threshold value is stored as data. When charge is accumulated in the floating gate, a high electric field is formed between a word line and a well formed in a substrate; thus, current which penetrates an insulating film flows from the well. As a result, charge is accumulated in the floating gate. When data is written with such through current, the number of times of writing and erasing data is about several hundred because an insulating film is deteriorated. Even in the case where measures to perform writing and erasing operation evenly on all addresses of a memory are taken so as to prevent the writing and erasing operation from being performed on one address in succession, the number of times of using the memory is several tens of thousands to several million at most.

When a semiconductor memory device including an oxide semiconductor is used instead of a non-volatile semiconductor memory device including a MOS transistor having a floating gate, an insulating film is not deteriorated because tunnel current is not used in writing and erasing data; thus, high reliability can be obtained. Further, a peripheral circuit such as a charge pump which generates high voltage needed for generating tunnel current is unnecessary. Furthermore, high voltage is unnecessary, which is effective in reducing power consumption. Such a semiconductor memory device including an oxide semiconductor can be used as a memory element included in a memory cell unit.

A basic circuit configuration of a semiconductor memory device including an oxide semiconductor and operation thereof will be described with reference to FIGS. 6A-1, 6A-2, and 6B. Note that in each of circuit diagrams, in some cases, "OS" is written beside a transistor in order to indicate that the transistor includes an oxide semiconductor.

First, the most basic circuit configuration and its operation will be described with reference to FIGS. 6A-1, 6A-2, and 6B. In the semiconductor memory device in FIG. 6A-1, a first wiring (1st Line) and a source electrode (or a drain electrode) of a transistor 160 are electrically connected to each other, and a second wiring (2nd Line) and the drain electrode (or the source electrode) of the transistor 160 are electrically connected to each other. In addition, a third wiring (3rd Line) and a source electrode (or a drain electrode) of a transistor 162 are electrically connected to each other, and a fourth wiring (4th Line) and a gate electrode of the transistor 162 are electrically connected to each other. In addition, a gate electrode of the transistor 160 and the drain electrode (or the source electrode) of the transistor 162 are electrically connected to one electrode of a capacitor 164, and a fifth wiring (5th Line) and the other electrode of the capacitor 164 are electrically connected to each other.

Here, a transistor including an oxide semiconductor is used as the transistor 162, for example. Off-state current of a transistor including an oxide semiconductor is extremely small. Therefore, when the transistor 162 is in an off state, a potential in the gate electrode of the transistor 160 can be held for a very long time. The capacitor 164 facilitates holding of charge applied to the gate electrode of the transistor 160 and reading of the held data.

Note that there is no particular limitation on a semiconductor material of the transistor 160. In order to increase the speed of reading data, it is preferable to use, for example, a transistor with high switching speed, such as a transistor formed using single crystal silicon. The transistor 160 is illustrated as an n-channel transistor in FIGS. 6A-1, 6A-2, and 6B; however, it may be a p-channel transistor.

Figures 1, 6A:
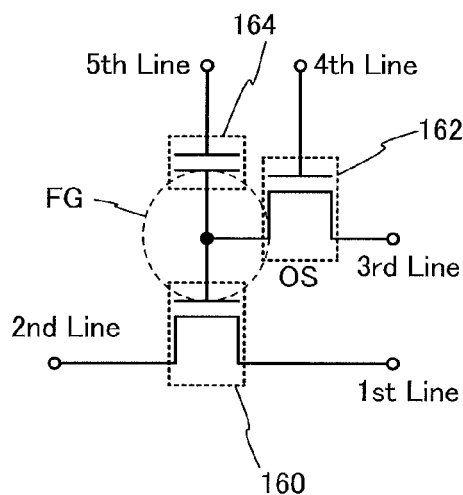
Figure 6B:
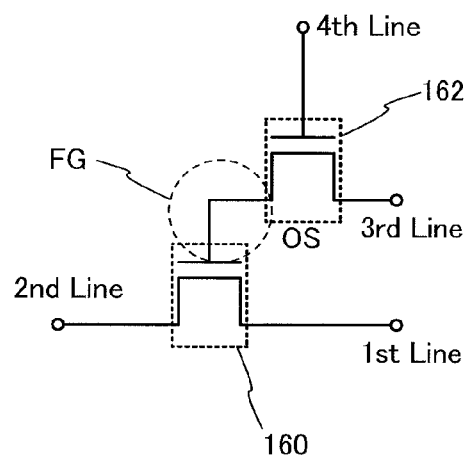
Figures 2, 6A:
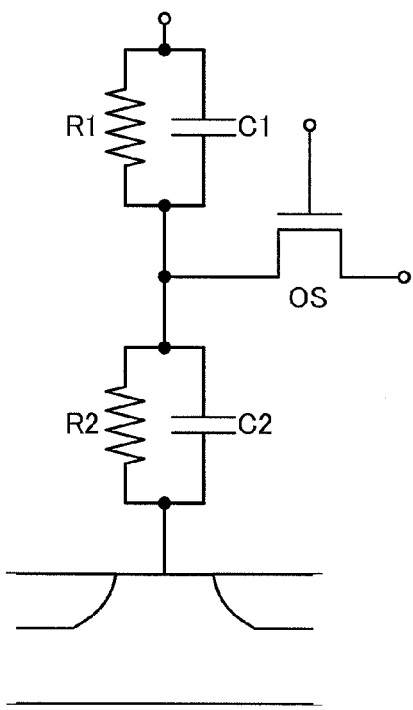

Alternatively, the capacitor 164 may be omitted as in FIG. 6B.

The semiconductor memory device in FIG. 6A-1 can write, hold, and read data as described below, utilizing a characteristic in which the potential of the gate electrode of the transistor 160 can be held.

Firstly, writing and holding of data will be described. The potential of the fourth wiring is set to a potential at which the transistor 162 is turned on, whereby the transistor 162 is turned on. Accordingly, the potential of the third wiring is supplied to the gate electrode of the transistor 160 and the one electrode of the capacitor 164. That is, predetermined charge is applied to the gate electrode of the transistor 160 (writing of data). Here, one of charges for applying two different levels of potential (hereinafter a charge for applying a low potential is referred to as charge $Q_L$ and a charge for applying a high potential is referred to as charge $Q_H$) is applied. Note that charges for applying three or more different levels of potential may be employed to improve storage capacity. After that, the potential of the fourth wiring is set to a potential at which the transistor 162 is turned off, whereby the transistor 162 is turned off. Thus, the charge applied to the gate electrode of the transistor 160 is held (holding of data).

Since the off-state current of the transistor 162 is extremely small, the charge in the gate electrode of the transistor 160 is held for a long period.

Secondly, reading of data will be described. While a predetermined potential (a fixed potential) is applied to the first wiring, an appropriate potential (a read-out potential) is applied to the fifth wiring, whereby the potential of the second wiring changes depending on the amount of charge held in the gate electrode of the transistor 160. This is because in general, when the transistor 160 is an n-channel transistor, an apparent threshold value $V_{th\_H}$ in the case where $Q_H$ is held in the gate electrode of the transistor 160 is lower than an apparent threshold value $V_{th\_L}$ in the case where $Q_L$ is held in the gate electrode of the transistor 160. Here, an apparent threshold value refers to the potential of the fifth wiring which is needed to turn on the transistor 160. Thus, by setting the potential of the fifth wiring to a potential $V_0$ which is between $V_{th\_H}$ and $V_{th\_L}$, charge held in the gate electrode of the transistor 160 can be determined. For example, in the case where $Q_H$ is applied in writing, when the potential of the fifth wiring is set to $V_0$ ($>V_{th\_H}$), the transistor 160 is turned on. In the case where $Q_L$ is applied in writing, even when the potential of the fifth wiring is set to $V_0$ ($<V_{th\_L}$), the transistor 160 remains off. Thus, the data held can be read by measuring the potential of the second wiring.

Note that in the case where memory cells are arrayed, it is necessary to read out data only from an intended memory cell. Thus, in order that data of a predetermined memory cell is read and data of the other memory cells is not read, in the case where the transistors 160 are connected in parallel, a potential at which the transistors 160 are in an off state regardless of a state of the gate electrodes, that is, a potential lower than $V_{th\_H}$ may be supplied to fifth wirings of the memory cells whose data is not to be read. On the other hand, in the case where the transistors 160 are connected in series, a potential at which the transistors 160 are in an on state regardless of the state of the gate electrodes, that is, a potential higher than $V_{th\_L}$, may be applied to the fifth wirings of the memory cells whose data is not to be read.

Thirdly, rewriting of data will be described. Rewriting of data is performed in a manner similar to that of the writing and holding of data. That is, the potential of the fourth wiring is set to a potential at which the transistor 162 is turned on, whereby the transistor 162 is turned on. Accordingly, the potential of the third wiring (a potential for new data) is applied to the gate electrode of the transistor 160 and the capacitor 164. After that, the potential of the fourth wiring is set to a potential at which the transistor 162 is turned off, whereby the transistor 162 is turned off. Thus, charge for the new data is applied to the gate electrode of the transistor 160.

In the semiconductor memory device described in this embodiment, data can be directly rewritten by another writing of data as described above. Therefore, extracting of charge from a floating gate with the use of high voltage, which is needed in a flash memory or the like, is not needed and thus a reduction in operation speed caused by erasing operation can be suppressed. In other words, high-speed operation of the semiconductor memory device can be realized.

Note that the drain electrode (or the source electrode) of the transistor 162 is electrically connected to the gate electrode of the transistor 160, and thereby has an effect similar to that of a floating gate of a floating-gate transistor which is used as a non-volatile memory element. In the following description, the portion where the drain electrode (or the source electrode) of the transistor 162 and the gate electrode of the transistor 160 are electrically connected to each other is called a node FG in some cases. When the transistor 162 is off, the node FG can be regarded as being embedded in an insulator and charge is held in the node FG. The off-state current of the transistor 162 including an oxide semiconductor is smaller than or equal to one hundred thousandth of the off-state current of a transistor including a silicon semiconductor; thus, loss of the charge accumulated in the node FG due to leakage current of the transistor 162 is negligible. That is, with the transistor 162 including an oxide semiconductor, a non-volatile memory device which can hold data without power supply can be realized.

For example, when the off-state current of the transistor 162 is smaller than or equal to 10 zA (1 zA (zeptoampere) is $1 \times 10^{-21}$ A) at room temperature (25° C.) and the capacitance value of the capacitor 164 is approximately 10 fF, data can be held for $10^4$ seconds or longer. It should be appreciated that the holding time changes depending on the transistor characteristics and the capacitance value.

In the semiconductor memory device described in this embodiment, a problem of deterioration of a gate insulating film (a tunnel insulating film), which occurs in a conventional floating-gate transistor, does not exist. That is, deterioration of a gate insulating film due to injection of electrons into a floating gate, which has been regarded as a problem, does not exist. This means that there is no limitation on the number of times of writing in principle. In addition, high voltage which is needed for writing or erasing data in a conventional floating-gate transistor is not necessary.

The components such as transistors in the semiconductor memory device in FIG. 6A-1 can be regarded as including a resistor and a capacitor as shown in FIG. 6A-2. That is, in FIG. 6A-2, the transistor 160 and the capacitor 164 are each regarded as including a resistor and a capacitor. R1 and C1 denote the resistance value and the capacitance value of the capacitor 164, respectively. The resistance value R1 corresponds to the resistance value of an insulating layer included in the capacitor 164. R2 and C2 denote the resistance value and the capacitance value of the transistor 160, respectively. The resistance value R2 corresponds to the resistance value of a gate insulating layer at the time when the transistor 160 is on. The capacitance value C2 corresponds to the capacitance value of so-called gate capacitance (capacitance between the gate electrode and the source electrode or drain electrode and capacitance between the gate electrode and the channel formation region).

A charge holding period (also referred to as a data holding period) is determined mainly by off-state current of the transistor 162 under the condition where gate leakage current of the transistor 162 is sufficiently small and R1 and R2 satisfy R1≥ROS and R2≥ROS, where ROS is the resistance value (also referred to as effective resistance) between the source electrode and the drain electrode at the time when the transistor 162 is off.

On the other hand, when the condition is not satisfied, it would be difficult to ensure a sufficient holding period even if the off-state current of the transistor 162 is small enough. This is because leakage current other than the off-state current of the transistor 162 (e.g., leakage current generated between the source electrode and the gate electrode) would be large. Thus, it can be said that the semiconductor memory device disclosed in this embodiment desirably satisfies the relation R1≥ROS and R2≥ROS.

It is desirable that C1 and C2 satisfy C1≥C2. This is because by increasing C1, the potential of the fifth wiring can be effectively applied to the node FG when the potential in the node FG is controlled by the fifth wiring, and thus the difference between the potentials applied to the fifth wiring (e.g., a reading potential and a non-read potential) can be reduced.

As described above, when the above relation is satisfied, a more favorable semiconductor memory device can be realized. Note that R1 and R2 are determined by the gate insulating layer included in the transistor 160 and an insulating layer included in the capacitor 164, respectively. Similarly, C1 and C2 are determined by the gate insulating layer of the transistor 160 and the insulating layer included in the capacitor 164, respectively. Therefore, the material, the thickness, and the like of the gate insulating layer are desirably set as appropriate so that the above relation may be satisfied.

In the semiconductor memory device described in this embodiment, the node FG has an effect similar to that of a floating gate of a floating-gate transistor in a flash memory or the like, but the node FG of this embodiment has a feature which is essentially different from that of the floating gate in the flash memory or the like.

In a flash memory, since a voltage applied to a control gate is high, it is necessary to keep a proper distance between cells in order to prevent the potential from affecting a floating gate of the adjacent cell. This is one of the factors inhibiting high integration of the semiconductor memory device. The factor is due to a basic principle of a flash memory that tunneling current is generated by application of a high electric field.

In contrast, the semiconductor memory device according to this embodiment is operated by switching of a transistor including an oxide semiconductor and does not use the above principle of charge injection by tunneling current. That is, unlike a flash memory, a high electric field for charge injection is not necessary. Accordingly, an effect of a high electric field for a control gate on an adjacent cell does not need to be taken into account, and thus high integration can be facilitated.

In addition, it is also advantage over a flash memory that a high electric field is unnecessary and a large peripheral circuit (such as a booster circuit) is unnecessary. For example, the maximum value of voltage applied to the memory cell according to this embodiment (the difference between the highest potential and the lowest potential applied to terminals of the memory cell at the same time) can be 5 V or lower, preferably 3 V or lower, in each memory cell in the case where two-level (one-bit) data is written.

In the case where the dielectric constant ∈r1 of the insulating layer included in the capacitor 164 is different from the dielectric constant ∈r2 of the insulating layer included in the transistor 160, C1 and C2 can easily satisfy C1≥C2 while S1 which is the area of the insulating layer included in the capacitor 164 and S2 which is the area of an insulating layer forming gate capacitance of the transistor 160 satisfy 2×S2≥S1 (desirably S2≥S1). In other words, C1≥C2 can be easily satisfied while the area of the insulating layer included in the capacitor 164 is small. Specifically, for example, when a film formed of a high-k material such as hafnium oxide or a stack of a film formed of a high-k material such as hafnium oxide and a film formed of an oxide semiconductor is used for the insulating layer included in the capacitor 164, ∈r1 can be set to 10 or more, preferably 15 or more, and when a film faulted of silicon oxide is used for the insulating layer forming the gate capacitance, ∈r2 can be set to 3 to 4.

Combination of such structures enables higher integration of the semiconductor memory device according to the disclosed invention.

One example of a circuit configuration of a NAND-type memory cell unit in which a semiconductor memory device including an oxide semiconductor is formed as a memory element included in the memory cell unit, and a principle of operation thereof will be described below. Note that a transistor including an oxide semiconductor is referred to as an oxide semiconductor transistor.

Figure 7:
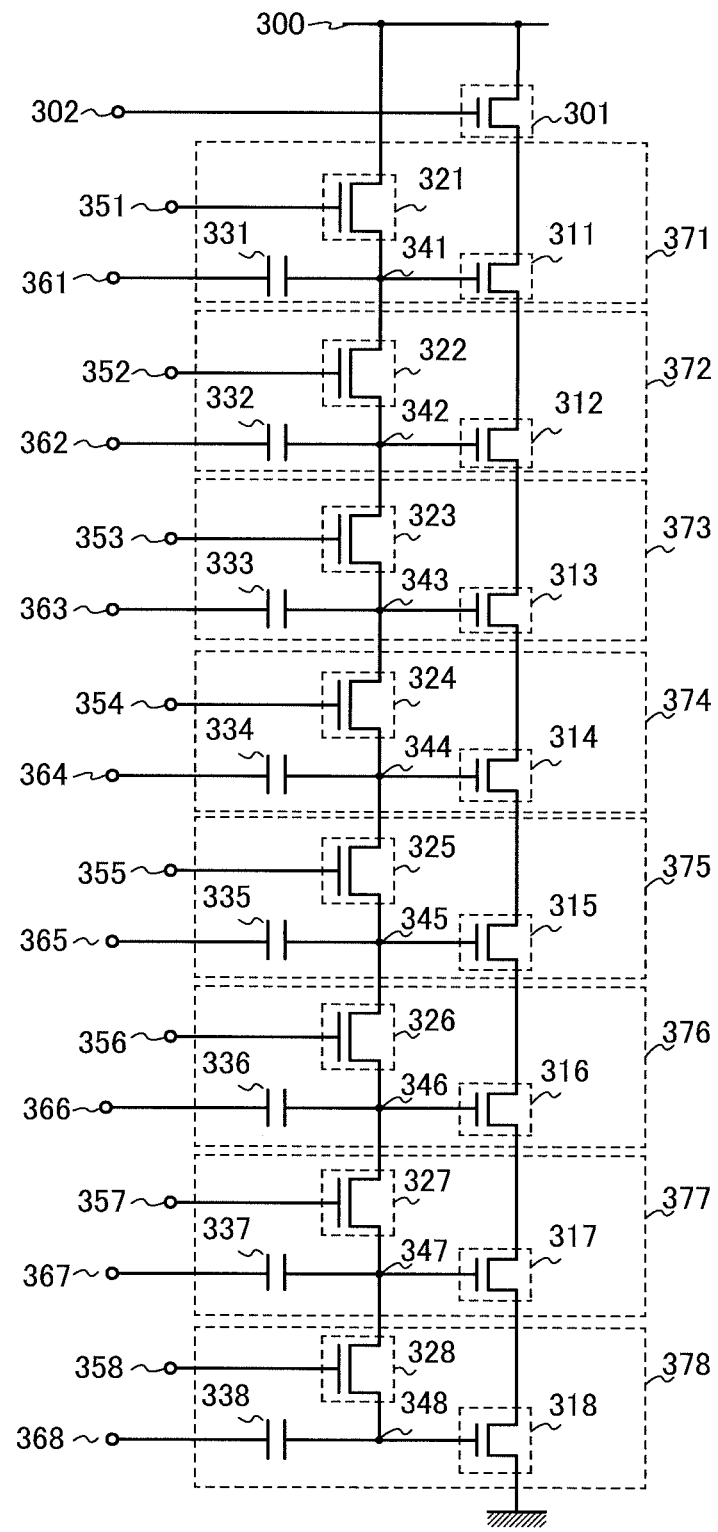
FIG. 7 is one example of a circuit diagram of a semiconductor memory device.

FIG. 7 illustrates one example of a configuration of a NAND-type memory cell unit. Eight memory cells 371 to 378 are connected in series, which include first to eighth floating nodes 341 to 348 serving as nodes for holding charge, first to eighth oxide semiconductor transistors 321 to 328, first to eighth reading transistors 311 to 318 formed using enhancement-type n-channel transistors, and first to eighth storage capacitors 331 to 338. One end of the eight memory cells is connected to a bit line 300 through a selection transistor 301 formed using an enhancement-type n-channel transistor, and the other end thereof is connected to GND through a source of the reading transistor 318. Control signals for the memory cells are input to a selection gate line 302, first to eighth word lines 361 to 368, and word lines 351 to 358 for the first to eighth oxide semiconductor transistors.

Figure 10A:
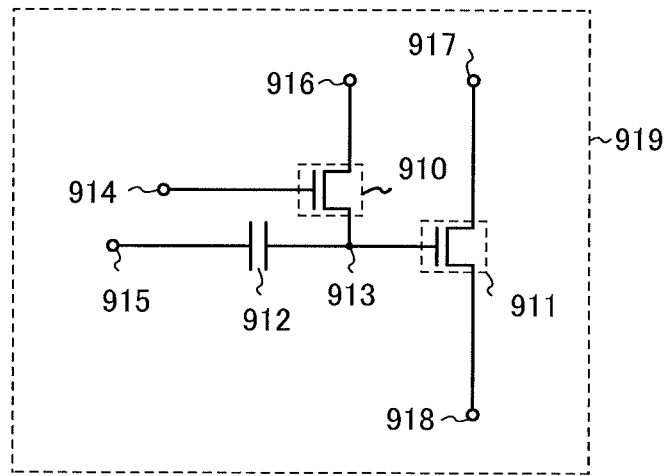
FIGS. 10A to 10C illustrate operation of a memory element.
Figure 10B:
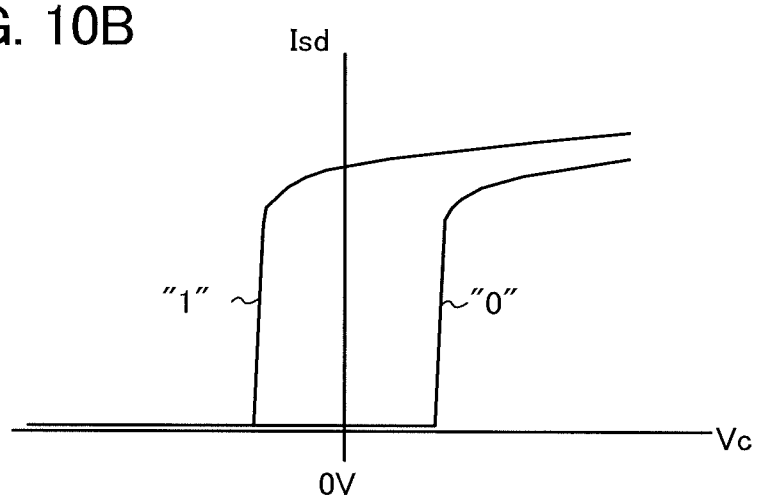
Figure 10C:
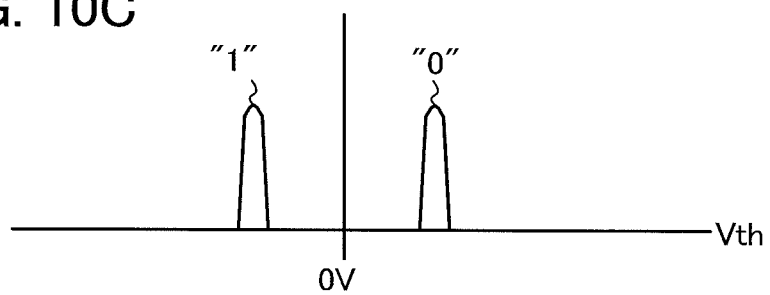

Memory cells 371 to 378 each have a threshold value which depends on data held therein. When the memory cell holds data "0", it has a positive threshold value. When the memory cell holds data "1", it has a negative threshold value. FIG. 10A is one example of a circuit diagram showing one memory cell of a NAND-type memory cell unit which includes eight NAND-type memory cells connected in series. FIG. 10B shows a relation between source-drain current Isd of a reading transistor 911 and Vc applied to a word line 915 of when data "1" and data "0" are stored in a floating node 913 connected to a storage capacitor 912. FIG. 10C illustrates distribution of a threshold value of the reading transistor 911 of when data "1" and data "0" are written to the floating node 913. Hereinafter, a relation between data (data "0" and data "1") written to the floating node 913 and the threshold value of the reading transistor 911 will be described with reference to FIGS. 10A, 10B, and 10C.

In the case where data "0" is written to the NAND-type memory cell of FIG. 10A, a source line 918 is supplied with 0 V, the word line 915 is supplied with 0 V, a drain terminal 917 of the reading transistor 911 is brought into a high impedance state, a word line 914 for an oxide semiconductor transistor is supplied with 4.5 V, and a bit line 916 is supplied with 0 V. Then, an oxide semiconductor transistor 910 is turned on, so that the floating node 913 is charged with the potential of the bit line 916, 0 V. In this state, the potential supplied to the word line 914 for the oxide semiconductor transistor is changed from "4.5 V" to "−1 V", so that the oxide semiconductor transistor 910 is turned off; thus, the potential of the floating node 913 is 0 V.

When data "0" is read out, the source line 918 is supplied with 0 V, the word line 915 is supplied with 0 V, and the word line 914 for the oxide semiconductor transistor is supplied with −1 V; thus, the oxide semiconductor transistor 910 is turned off. In this state, the drain terminal 917 of the reading transistor 911 is pre-charged with 3 V. Since data "0" is stored in the floating node 913, the gate potential of the reading transistor 911 is 0 V. Since the memory cell 919 is kept in an off state while having a positive threshold value as illustrated in FIGS. 10B and 10C, the drain terminal 917 and the source line 918 are brought out of electrical conduction. A pre-charge voltage of 3 V is detected when the potential of the drain terminal 917 of the reading transistor 911 is detected.

In the case where data "1" is written to the NAND-type memory cell of FIG. 10A, the source line 918 is supplied with 0 V, the word line 915 is supplied with 0 V, the drain terminal 917 of the reading transistor 911 is brought into a high impedance state, the word line 914 for the oxide semiconductor transistor is supplied with 4.5 V, and the bit line 916 is supplied with 3 V. Then, the oxide semiconductor transistor 910 is turned on, so that the floating node 913 is charged with the potential of the bit line 916, 3 V. In this state, the potential supplied to the word line 914 for the oxide semiconductor transistor is changed from "4.5 V" to "−1 V", so that the oxide semiconductor transistor 910 is turned off; thus, the potential of the floating node 913 is 3 V.

When data "1" is read out, the source line 918 is supplied with 0 V, the word line 915 is supplied with 0 V, and the word line 914 for the oxide semiconductor transistor is supplied with −1 V; thus, the oxide semiconductor transistor 910 is turned off. In this state, the drain terminal 917 of the reading transistor 911 is pre-charged with 3 V. Since data "1" is stored in the floating node 913, the gate potential of the reading transistor 911 is 3 V. Since the memory cell 919 is kept in an on state while having a negative threshold value as illustrated in FIGS. 10B and 10C, the drain terminal 917 and the source line 918 are brought into electrical conduction. A voltage of 0 V is detected when the potential of the drain terminal 917 of the reading transistor 911 is detected.

In the above manner, which data (data "0" or data "1") is stored in the NAND-type memory cell is judged by detecting the potential of the drain terminal 917 of the reading transistor 911 when data is read out.

However, in a semiconductor memory device which is actually used, writing operation and reading operation are performed for a NAND-type memory cell unit, so that writing operation and reading operation performed for a selected memory cell will be described with reference to the NAND-type memory cell unit of FIG. 7. Here, the case where data "0" is written to a third memory cell 373 and data "1" is written to a fifth memory cell 375 is assumed. In the case where data "0" is written, the bit line 300 is supplied with 0 V from an external input/output signal line. Next, in order not to set the potential of the bit line 300 to GND by mistake, the selection gate line 302 is supplied with 0 V so that the selection transistor 301 is turned off. In order that the memory cells 371 to 373 are selected, the word lines 351 to 353 for the oxide semiconductor transistors are supplied with 4.5 V and the word lines 361 to 363 are supplied with 0 V. Then, the oxide semiconductor transistors 321 to 323 are turned on, so that the potentials of the floating nodes 341 to 343 become equal to the potential of the bit line 300. After that, the word lines 351 to 353 for the oxide semiconductor transistors are supplied with −1 V, so that the oxide semiconductor transistors 321 to 323 are turned off. In this manner, data "0" is stored in the floating nodes 341 to 343.

Next, in order to write data "1" to the memory cell 375, the bit line 300 is supplied with 3 V from the data signal line. The selection gate line 302 is supplied with 0 V so that the selection transistor 301 is turned off. In order that the memory cells 371 to 375 are selected, the word lines 351 to 355 for the oxide semiconductor transistors are supplied with 4.5 V and the word lines 361 to 365 are supplied with 0 V. Then, the potentials of the floating nodes 341 to 345 become equal to the potential of the bit line 300, 3 V. Here, there is a problem in that data of the floating node 343 to which data "0" has been written is changed from data "0" to data "1". In order that data is prevented from being written again to the memory cell to which data has been written, in the NAND-type memory in this embodiment, writing operation needs to be performed from the memory cell in the eighth row to the memory cell in the first row sequentially.

Then, reading operation of data stored in the memory cell 375 is described. As for data reading, there is no particular limitation on the order of rows on which reading operation is performed, and data of the selected memory cell can be directly read out. First, the potential of the bit line 300 is set to 3 V through pre-charge operation, so that the selection gate line 302 is supplied with 3 V and is turned on. In order that the memory cell 375 is selected, the word lines 361 to 364 and the word lines 366 to 368 are supplied with 5 V. Then, the reading transistors 311 to 314 and the reading transistors 316 to 318 are forcibly turned on regardless of the potentials of the floating nodes. On the other hand, the word line 365 is supplied with 0 V, and the reading transistor 315 is controlled to be "on" or "off" depending on data of the floating node 345. If data "0" is held in the floating node 345, the reading transistor 315 is turned off. As a result, the bit line 300 is not connected to GND, so that the bit line 300 has a potential of 3 V which is set through pre-charge operation.

In the case where data "1" is stored in the floating node 345, the potential of the floating node 345 becomes 3 V, so that the reading transistor 315 is turned on. Since the word lines 361 to 364 and the word lines 366 to 368 are supplied with 5 V in order that the memory cell 375 is selected, the reading transistors 311 to 314 and the reading transistors 316 to 318 are turned on; thus, the bit line 300 is connected to GND, and the potential of the bit line 300 is changed from 3 V which is set through the pre-charge operation to 0 V. In the above manner, by detecting the potential of the bit line 300, which data (data "0" or data "1") is stored in the memory cell is judged.

Embodiment 4

Figure 8:
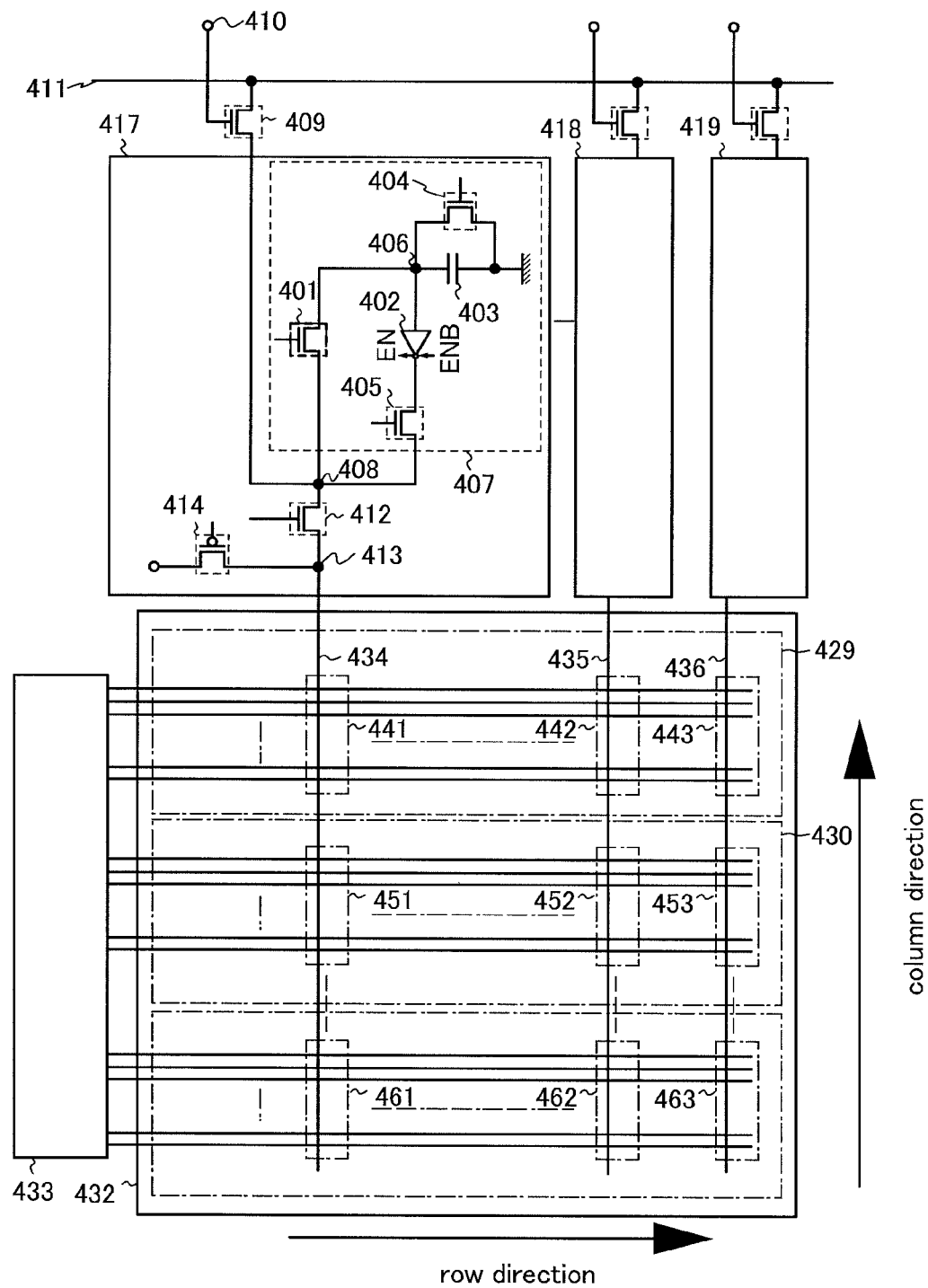
FIG. 8 is one example of a circuit diagram of a semiconductor memory device.

One example of a configuration of the present invention will be described with reference to FIG. 8. One example of a circuit configuration of a NAND-type memory cell unit in which a semiconductor memory device including an oxide semiconductor is formed as a memory element included in the memory cell unit described in Embodiment 3, and a principle of operation thereof will be described below.

A semiconductor memory device of this embodiment includes a memory cell array 432 in which NAND-type memory cell units are arrayed; and a word line driver circuit 433. In addition, the semiconductor memory device includes a data holding circuit 407 including a transistor 401, a transistor 404, a transistor 405, a three-state inverter 402, and a capacitor 403; a sense amplifier latch circuit 417 including the data holding circuit 407, a node 408, a node 406, a transmission circuit 412, and a pre-charge transistor 414; a bit line 413; a column gate 409; a column gate control line 410; a data signal line 411; a sense amplifier latch circuit 418; and a sense amplifier latch circuit 419. Data for one page can be copied to another page without using an external device.

In the memory cell array 432, NAND-type memory cell units are arranged in m columns in the row direction and n rows in the column direction, and (m×n) NAND-type memory cell units are included.

The number of the bit lines is the same as that of the NAND-type memory cell units arranged in the row direction. One bit line is shared by n NAND-type memory cell units arranged in the column direction. In FIG. 8, NAND-type memory cell units 441 to 463 are illustrated.

The number of the sense amplifier latch circuits is the same as that of the bit lines provided in the memory cell array 432. Data detection of the memory cells and data writing to the memory cells can be performed per page.

The word line driver circuit 433 has a structure with which the memory cells can be selected per page.

Operation in which data of one block, i.e., a memory block 429 is copied to a memory block 430 without using an external device is described below. With the word line driver circuit 433, the memory cells of the eighth row in the NAND-type memory cell units 441 to 442 and 443 included in the memory block 429, which correspond to one page, are brought into a selection state, and m bit lines, i.e., a bit line 434 in the first row to a bit line 436 in the m-the row are pre-charged with a predetermined potential. During the pre-charge, the transmission circuit 412 and the transistor 401 are turned on; thus, the node 406 is charged with the potential of the bit line 434, which is handled as data of the memory cell, through the transmission circuit 412, the node 408, and the transistor 401. In this state, the transistor 401 is turned off, whereby data is held in the node 406.

Next, operation in which data held in the data holding circuit 407 is written to the memory cells of the eighth row in the memory block 430 is described. The three-state inverter 402 is brought into an active state to transmit data held in the node 406 to the bit line 413 through the transistor 405 and the transmission circuit 412. The operation in which data of the memory cell is held in the data holding circuit 407 and the operation in which the held data is transmitted to the bit line 413 are performed for all the NAND-type memory cell units included in the memory block 429. After data held in the data holding circuit 407 is transmitted to the bit line 413, all the memory cells in the memory block 430 are brought into a selection state by the word line driver circuit 433; thus, writing operation is performed for the all the memory cells in the memory block 430, so that copy back in the memory cells in the eighth row is completed. After that, copy back is performed from the memory cells in the seventh row to the memory cells in the first row in the memory block 430; thus, copy back of one block is completed.

According to one example of the above structure, data in the memory block 429 for one page can be copied to the memory block 430 without using an external device. Further, one embodiment of the present invention, which includes sense amplifier latch circuits connected in parallel for one page, performs copy back operation at once; thus, copy back operation can be performed per page.

Embodiment 5

One example of a configuration of the present invention will be described with reference to FIG. 9. One example of a circuit configuration of a NOR-type memory cell unit in which a semiconductor memory device including an oxide semiconductor is formed as a memory element included in the memory cell unit, and a principle of operation thereof will be described below.

A semiconductor memory device described in this embodiment includes a memory cell array 532 in which NOR-type memory cell units are arrayed; and a word line driver circuit 533. In addition, the semiconductor memory device includes a data holding circuit 507 including a transistor 501, a transistor 504, a transistor 505, a three-state inverter 502, and a capacitor 503; a sense amplifier latch circuit 517 including the data holding circuit 507, a node 508, a node 506, a transmission circuit 512, and an n-channel transistor 514 which is used as a pull-down resistor and in which a gate and a drain are connected to each other; a bit line 513; a column gate 509; a column gate control line 510; a data signal line 511; a sense amplifier latch circuit 518; and a sense amplifier latch circuit 519. Data for one page can be copied to another page without using an external device.

The resistance of the n-channel transistor 514 which is used as a pull-down resistor and in which the gate and the drain are connected to each other is higher than the on-state resistance of a p-channel transistor that is used as a reading transistor in the memory cell. It is preferable that the resistance value of the reading transistor in an off state be sufficiently larger than that of the n-channel transistor 514. A resistor may be used instead of the n-channel transistor 514 which is used as a pull-down resistor and in which the gate and the drain are connected to each other as long as the above condition is satisfied.

Figure 11A:
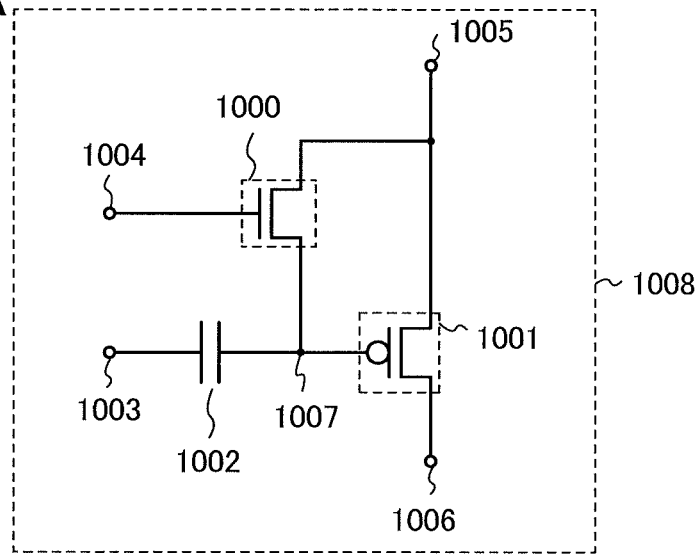
FIGS. 11A to 11C illustrate operation of a memory element.
Figure 11B:
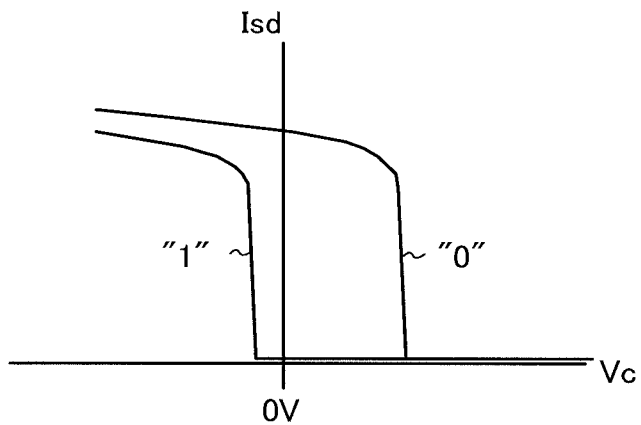
Figure 11C:
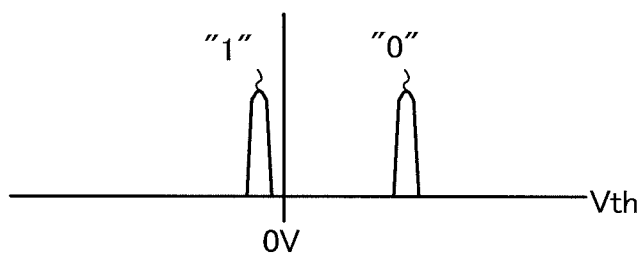

First, only one NOR-type memory cell is used for describing the reading operation and writing operation of the NOR-type memory cells. FIG. 11A is one example of a circuit diagram showing one memory cell of a NOR-type memory cell array. FIG. 11B is a graph showing a relation between source-drain current Isd of a reading transistor 1001 and voltage Vc applied to a word line 1003 of when data "1" and data "0" are stored in a floating node 1007. FIG. 11C is a graph showing distribution of a threshold value of the reading transistor 1001 of when data "1" and data "0" are written to the floating node 1007.

The NOR-type memory cell in FIG. 11A includes the reading transistor 1001 which is formed using an enhancement-type p-channel transistor, a storage capacitor 1002, and an oxide semiconductor transistor 1000. The NOR-type memory cell also includes a bit line 1005 to which a source or a drain of the oxide semiconductor transistor 1000 and a source or a drain of the reading transistor 1001 are connected.

In the case where data "1" is written to the NOR-type memory cell of FIG. 11A, a source line 1006 is supplied with 2 V, the word line 1003 is supplied with 0 V, the bit line 1005 is supplied with 2 V, and a word line 1004 for an oxide semiconductor transistor is supplied with 4 V. Then, the oxide semiconductor transistor 1000 is turned on, so that the floating node 1007 is charged with the potential of the bit line 1005, 2 V. In this state, the potential supplied to the word line 1004 for the oxide semiconductor transistor is changed from "4 V" to "−1 V", so that the oxide semiconductor transistor 1000 is turned off; thus, the potential of the floating node 1007 is about 2 V. In the memory cell to which data has been written, in order not to turn on the reading transistor 1001 in a standby period before the following reading operation so that power consumption can be prevented from being increased, the word line 1003 is supplied with a fixed potential of 2 V; thus, the reading transistor 1001 is forcibly turned off regardless of data held in the floating node 1007.

When data "1" is read out, the source line 1006 is supplied with 2 V, the word line 1003 is supplied with 0 V, and the word line 1004 for the oxide semiconductor transistor is supplied with −1 V; thus, the oxide semiconductor transistor 1000 is turned off. In the case where data "1" is held in the floating node 1007, the reading transistor 1001 is turned off. The bit line and a GND terminal are connected with a resistor interposed therebetween, whereby the potential of the bit line 1005 is 0 V when data "1" is held in the floating node 1007. The memory cell 1008 has a negative threshold value as illustrated in FIGS. 11B and 11C.

In the case where data "0" is written to the NOR-type memory cell of FIG. 11A, the source line 1006 is supplied with 2 V, the word line 1003 is supplied with 0 V, the bit line 1005 is supplied with 0 V, and the word line 1004 for the oxide semiconductor transistor is supplied with 4 V. Then, the oxide semiconductor transistor 1000 is turned on, so that the floating node 1007 is charged with the potential of the bit line 1005, 0 V. The memory cell to which data has been written is supplied with a fixed potential of 2 V through the word line 1003, so that the reading transistor 1001 is forcibly turned off. In this state, the potential supplied to the word line 1004 for the oxide semiconductor transistor is changed from "4 V" to "−1 V", so that the oxide semiconductor transistor 1000 is turned off; thus, the potential of the floating node 1007 is 0 V.

When data "0" is read out, the source line 1006 is supplied with 2 V, the word line 1003 is supplied with 0 V, and the word line 1004 for the oxide semiconductor transistor is supplied with −1 V; thus, the oxide semiconductor transistor 1000 is turned off. Since data "0" is stored in the floating node 1007, the gate-source potential of the reading transistor 1001 is −2 V. The memory cell 1008 has a positive threshold value as illustrated in FIGS. 11B and 11C, and is kept in an on state. As described above, the bit line 1005 and the GND terminal are connected with the resistor interposed therebetween; however, the on-state resistance of the reading transistor 1001 is lower than the pull-down resistance, so that a voltage of 2 V is detected from the bit line.

In this manner, which data (data "0" or data "1") is stored in the NOR-type memory cell can be judged by detection of the potential of the bit line 1005.

Figure 9:
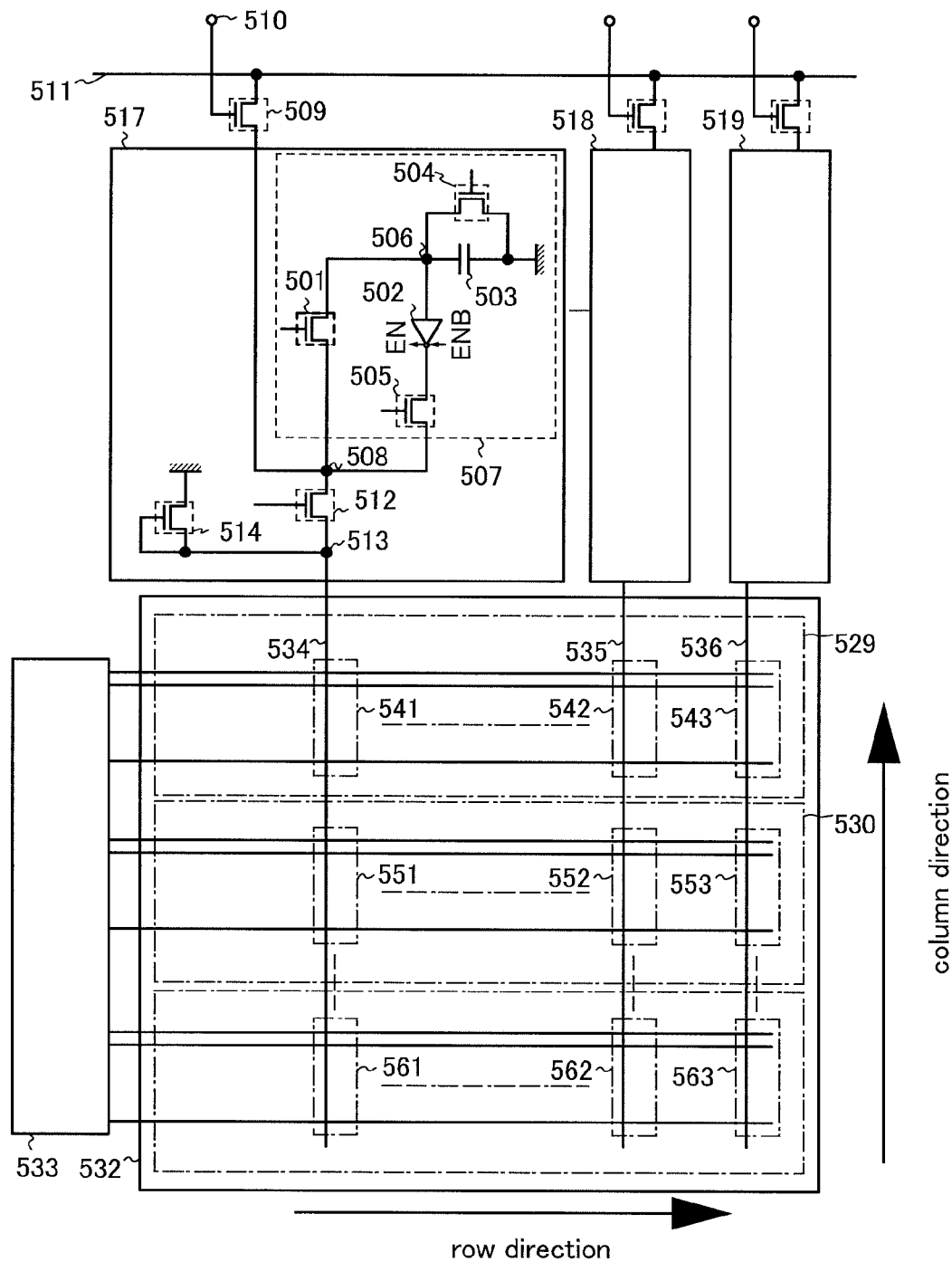
FIG. 9 is one example of a circuit diagram of a semiconductor memory device.

Described with reference to the circuit diagram of FIG. 9 is operation in which data of a first page 529 corresponding to the memory cells for one page disposed in the first row of the NOR-type memory cell array is copied to a second page 530 corresponding to the memory cells for one page disposed in the second row of the NOR-type memory cell array. In FIG. 9, NOR-type memory cells 541 to 563 are illustrated.

With the use of the word line driver circuit 533, the memory cells for one page, that is, the NOR-type memory cells 541 to 542 and 543 included in the first page 529 are selected, and m bit lines, that is, the bit line 534 in the first column to the bit line 536 in the m-th column have potentials which depend on data stored in the memory cells. The potential of the bit line 534, which is handled as data stored in the memory cell, is transmitted to the node 506 through the transmission circuit 512, the node 508, and the transistor 501. When the transistor 501 is turned off, inverted data of reading data is held in the node 506.

Next, in operation in which data held in the data holding circuit 507 is written to the memory cells of the second page 530, data held in the node 506 is transmitted to the bit line 534 through the three-state inverter 502, the transistor 505, and the transmission circuit 512. The operation in which data in the memory cells is held in the data holding circuit 507 and the operation in which data held in the node 506 is transmitted to the bit line are performed for all the NOR-type memory cells for the first page 529. After data held in the data holding circuit 507 is transmitted to the bit line, all the memory cells of the second page 530 are selected by the word line driver circuit 533, whereby data is written to all the memory cells of the second page 530 and copy back of one page is completed.

According to one example of the above structure, data for one page, i.e., the first page 529 can be copied to the second page 530 without using an external device. Further, one embodiment of the present invention, which includes sense amplifier latch circuits connected in parallel for one page, performs copy back operation at once; thus, copy back operation can be performed per page.

Embodiment 6

In this embodiment, a structure and a manufacturing method of a semiconductor device according to one embodiment of the disclosed invention will be described with reference to FIGS. 12A and 12B, FIGS. 13A to 13G FIGS. 14A to 14E, FIGS. 15A to 15D, FIGS. 16A to 16D, FIGS. 17A to 17C, and FIGS. 20A to 20E.

<Cross-Sectional Structure and Planar Structure of Semiconductor Device>

Figure 12A:
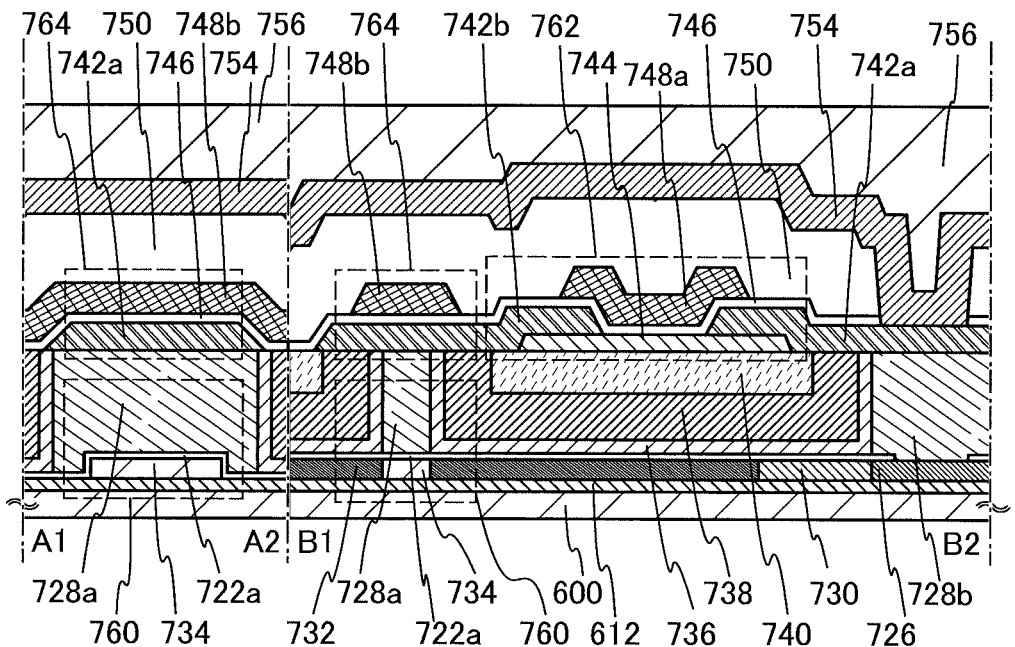
FIGS. 12A and 12B are examples of a cross-sectional view and a plan view of a semiconductor memory device.
Figure 12B:
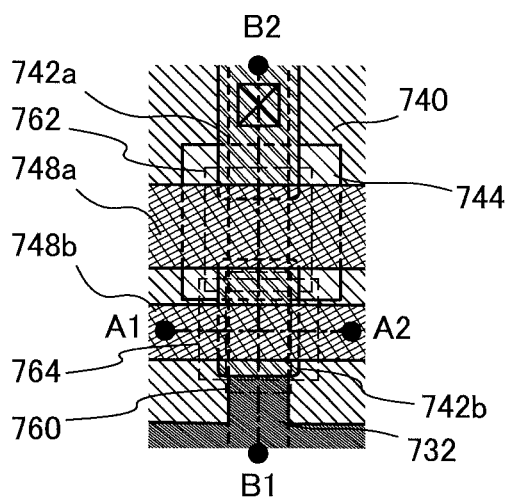

FIGS. 12A and 12B illustrate an example of a structure of a semiconductor device. FIG. 12A illustrates a cross section of the semiconductor device, and FIG. 12B illustrates a plan view of the semiconductor device. Here, FIG. 12A illustrates a cross section taken along lines A1-A2 and B1-B2 in FIG. 12B. The semiconductor device illustrated in FIGS. 12A and 12B includes a transistor 760 including a first semiconductor material in a lower portion, and a transistor 762 including a second semiconductor material in an upper portion. Here, the first semiconductor material and the second semiconductor material are preferably different from each other. For example, the first semiconductor material may be a semiconductor material other than an oxide semiconductor and the second semiconductor material may be an oxide semiconductor. The semiconductor material other than an oxide semiconductor can be, for example, silicon, germanium, silicon germanium, silicon carbide, gallium arsenide, or the like and is preferably single crystalline. A transistor including such a semiconductor material other than an oxide semiconductor can easily operate at high speed. Alternatively, an organic semiconductor material or the like may be used. On the other hand, a transistor including an oxide semiconductor can hold charge for a long time owing to its characteristics. The semiconductor device in FIGS. 12A and 12B can be used as a memory cell.

Since the feature of this embodiment is to use a semiconductor material like an oxide semiconductor, which can sufficiently reduce off-state current, for the transistor 762 in order to hold data, it is not necessary to limit specific conditions such as a structure, a material, and the like of the semiconductor device to those given here.

The transistor 760 in FIGS. 12A and 12B includes a channel formation region 734 provided in a semiconductor layer over a semiconductor substrate 600, impurity regions 732 (also referred to as a source region and a drain region) with the channel formation region 734 provided therebetween, a gate insulating layer 722a provided over the channel formation region 734, and a gate electrode 728a provided over the gate insulating layer 722a so as to overlap with the channel formation region 734. Note that a transistor whose source electrode and drain electrode are not illustrated in a drawing is referred to as a transistor for the sake of convenience in some cases. Further, in such a case, in description of the connection of a transistor, a source region and a source electrode might be collectively referred to as a "source electrode," and a drain region and a drain electrode might be collectively referred to as a "drain electrode". That is, in this specification, the term "source electrode" may include a source region. Also, the term "drain electrode" may include a drain region.

Further, a conductive layer 728b is connected to an impurity region 726 provided in the semiconductor layer over the semiconductor substrate 600. Here, the conductive layer 728b functions as a source electrode or a drain electrode of the transistor 760. In addition, an impurity region 730 is provided between the impurity region 732 and the impurity region 726. Further, insulating layers 736, 738, and 740 are provided so as to cover the transistor 760. Note that in order to realize higher integration, the transistor 760 preferably has a structure without a sidewall insulating layer as illustrated in FIGS. 12A and 12B. On the other hand, when the characteristics of the transistor 760 have priority, the sidewall insulating layer may be formed on a side surface of the gate electrode 728a and the impurity region 732 may include a region having a different impurity concentration.

The transistor 762 in FIGS. 12A and 12B includes an oxide semiconductor layer 744 which is provided over the insulating layer 740 and the like; a source electrode (or a drain electrode) 742a and a drain electrode (or a source electrode) 742b which are electrically connected to the oxide semiconductor layer 744; a gate insulating layer 746 which covers the oxide semiconductor layer 744, the source electrode 742a, and the drain electrode 742b; and a gate electrode 748a which is provided over the gate insulating layer 746 so as to overlap with the oxide semiconductor layer 744.

Here, it is preferable that the oxide semiconductor layer 744 be highly purified by sufficient removal of impurities such as hydrogen and sufficient supply of oxygen. Specifically, the hydrogen concentration in the oxide semiconductor layer 744 is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$, for example. Note that the hydrogen concentration in the oxide semiconductor layer 744 is measured by secondary ion mass spectroscopy (SIMS). Thus, in the oxide semiconductor layer 744 in which the hydrogen concentration is sufficiently reduced so that the oxide semiconductor layer is highly purified and in which defect levels in the energy gap due to oxygen deficiency are reduced by sufficient supply of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer ($\mu$m) of channel width) at room temperature (25° C.) is 100 zA (1 zA (zeptoampere) is $1\times10^{-21}$ A) or less, preferably 10 zA or less. With the use of such an i-type (intrinsic) or substantially i-type oxide semiconductor, the transistor 762 which has significantly excellent off-state current characteristics can be obtained.

Note that it has been pointed out that an oxide semiconductor is insensitive to impurities, there is no problem even when a considerable amount of metal impurities is contained in the film, and therefore, soda-lime glass which contains a large amount of alkali metal such as sodium and is inexpensive can also be used (Non-Patent Document 1). However, such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes Na$^+$ when an insulating film in contact with the oxide semiconductor film is an oxide and Na diffuses into the insulating film. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $5\times10^{19}$ cm$^{-3}$, particularly less than or equal to $5\times10^{18}$ cm$^{-3}$, the concentration of the above impurity is preferably reduced. Specifically, the Na concentration measured by secondary ion mass spectrometry is less than or equal to $5\times10^{16}$/cm$^3$, preferably less than or equal to $1\times10^{16}$/cm$^3$, more preferably less than or equal to $1\times10^{15}$/cm$^3$. In a similar manner, the Li concentration measured by secondary ion mass spectrometry is less than or equal to $5\times10^{15}$/cm$^3$, preferably less than or equal to $1\times10^{15}$/cm$^3$. In a similar manner, the K concentration measured by secondary ion mass spectrometry is less than or equal to $5\times10^{15}$/cm$^3$, preferably less than or equal to $1\times10^{15}$/cm$^3$.

An oxide semiconductor preferably has so-called p$^-$ type conductivity, in which the Fermi level ($E_f$) and the intrinsic Fermi level ($E_i$) are equal to each other ($E_f=E_i$), or the intrinsic Fermi level ($E_i$) is higher than the Fermi level ($E_f$) ($E_f<E_i$). Note that an oxide semiconductor preferably has i-type (intrinsic) conductivity or substantially i-type (intrinsic) conductivity because the Fermi level ($E_f$) can be easily controlled by addition of impurities. The gate electrode is preferably formed using a material having a high work function ($\phi_M$). With the above structure, the transistor can be normally off. Therefore, the off-state current value at 85° C. and that at room temperature of the transistor can be 1 yA or less and 0.1 yA or less, respectively; thus, a transistor whose off-state current is low can be obtained. When such a transistor is used for a memory element, data retention (memory retention) characteristics of a semiconductor device can be improved.

Note that although the transistor 762 in FIGS. 12A and 12B includes the oxide semiconductor layer 744 which is processed into an island shape in order to suppress leakage current between elements which is caused due to miniaturization, the oxide semiconductor layer 744 which is not processed into an island shape may be employed. In the case where the oxide semiconductor layer is not processed into an island shape, contamination of the oxide semiconductor layer 744 due to etching in the process can be prevented.

The capacitor 764 in FIGS. 12A and 12B includes the drain electrode 742b, the gate insulating layer 746, and a conductive layer 748b. That is, the drain electrode 742b serves as one electrode of the capacitor 764, and the conductive layer 748b serves as the other electrode of the capacitor 764. With such a structure, capacitance can be sufficiently secured. Further, insulation between the drain electrode 742b and the conductive layer 748b can be adequately secured by stacking the oxide semiconductor layer 744 and the gate insulating layer 746. Further alternatively, the capacitor 764 may be omitted in the case where a capacitor is not needed.

In this embodiment, the transistor 762 and the capacitor 764 are provided so as to overlap with the transistor 760 at least partly. By employing such a planar layout, high integration can be realized. For example, when F is used to express the minimum feature size, the area of a memory cell can be expressed as 15 F$^2$ to 25 F$^2$.

An insulating layer 750 is provided over the transistor 762 and the capacitor 764. A wiring 754 is provided in an opening formed in the gate insulating layer 746 and the insulating layer 750. The wiring 754 connects one memory cell to another memory cell. The wiring 754 is electrically connected to the impurity region 726 through the source electrode 742a and the conductive layer 728b. The above structure allows reduction in the number of wirings as compared to a structure in which the source region or the drain region in the transistor 760 and the source electrode 742a in the transistor 762 are connected to different wirings. Thus, the integration degree of the semiconductor memory device can be increased.

Since the conductive layer 728b is provided, a position where the impurity region 726 and the source electrode 742a are connected and a position where the source electrode 742a and the wiring 754 are connected can overlap with each other. With such a planar layout, the element area can be prevented from increasing owing to contact regions. In other words, the integration degree of the semiconductor memory device can be increased.

FIGS. 20A to 20E are cross-sectional views of transistors which have different structures from the transistor 762. Note that the structures of FIGS. 20A to 20E can be combined with any of the structures of FIGS. 12A and 12B, FIGS. 13A to 13G, FIGS. 14A to 14E, FIGS. 15A to 15D, FIGS. 16A to 16D, and FIGS. 17A to 17C as appropriate.

Figure 20A:
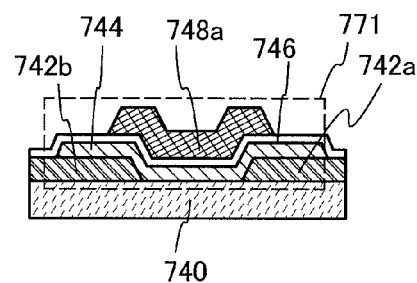
FIGS. 20A to 20E are cross-sectional views of semiconductor memory devices.

A transistor 771 in FIG. 20A is the same as the transistor 762 in that it includes, over the insulating layer 740, the oxide semiconductor layer 744, the source electrode (or the drain electrode) 742a and the drain electrode (or the source electrode) 742b which are electrically connected to the oxide semiconductor layer 744, the gate insulating layer 746, and the gate electrode 748a. A difference between the transistor 762 and the transistor 771 is positions where the oxide semiconductor layer 744 is connected to the source electrode (or the drain electrode) 742a and the drain electrode (or the source electrode) 742b. That is, in the transistor 771, lower portions of the oxide semiconductor layer 744 are in contact with the source electrode (or the drain electrode) 742a and the drain electrode (or the source electrode) 742b. The other components are the same as those of the transistor 762 in FIGS. 12A and 12B; thus, the description of FIGS. 12A and 12B, FIGS. 13A to 13G, FIGS. 14A to 14E, FIGS. 15A to 15D, FIGS. 16A to 16D, and FIGS. 17A to 17C can be referred to for the details.

Figure 20B:
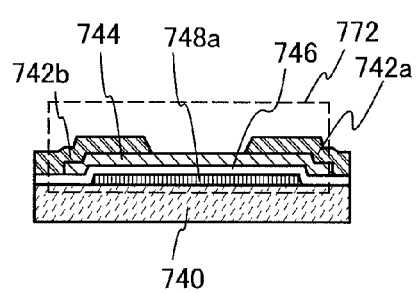

A transistor 772 in FIG. 20B is the same as the transistor 762 in that it includes, over the insulating layer 740, the oxide semiconductor layer 744, the source electrode (or the drain electrode) 742a and the drain electrode (or the source electrode) 742b which are electrically connected to the oxide semiconductor layer 744, the gate insulating layer 746, and the gate electrode 748a. A difference between the transistor 762 and the transistor 772 is a positional relationship between the oxide semiconductor layer 744 and the gate electrode 748a. That is, in the transistor 772, the gate electrode 748a is provided below the oxide semiconductor layer 744. The other components are the same as those of the transistor 762 in FIGS. 12A and 12B; thus, the description of FIGS. 12A and 12B, FIGS. 13A to 13G, FIGS. 14A to 14E, FIGS. 15A to 15D, FIGS. 16A to 16D, and FIGS. 17A to 17C can be referred to for the details.

Figure 20C:
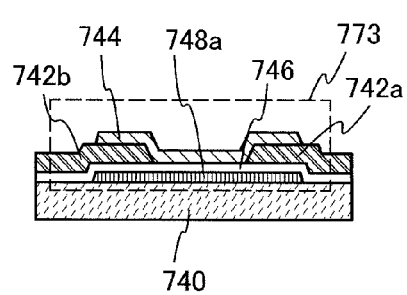

A transistor 773 in FIG. 20C is the same as the transistor 762 in that it includes, over the insulating layer 740, the oxide semiconductor layer 744, the source electrode (or the drain electrode) 742a and the drain electrode (or the source electrode) 742b which are electrically connected to the oxide semiconductor layer 744, the gate insulating layer 746, and the gate electrode 748a. A difference between the transistor 762 and the transistor 773 is a positional relationship between the oxide semiconductor layer 744 and the gate electrode 748a and positions where the oxide semiconductor layer 744 is connected to the source electrode (or the drain electrode) 742a and the drain electrode (or the source electrode) 742b. That is, in the transistor 773, the gate electrode 748a is provided below the oxide semiconductor layer 744, and lower portions of the oxide semiconductor layer 744 are in contact with the source electrode (or the drain electrode) 742a and the drain electrode (or the source electrode) 742b. The other components are the same as those of the transistor 762 in FIGS. 12A and 12B; thus, the description of FIGS. 12A and 12B, FIGS. 13A to 13G, FIGS. 14A to 14E, FIGS. 15A to 15D, FIGS. 16A to 16D, and FIGS. 17A to 17C can be referred to for the details.

Figure 20D:
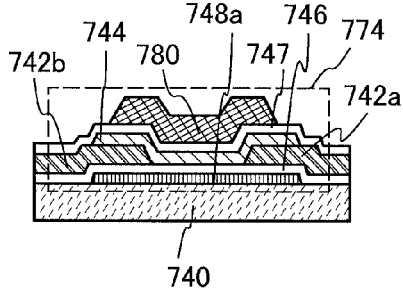

A transistor 774 in FIG. 20D is the same as the transistor 773 in that it includes, over the insulating layer 740, the oxide semiconductor layer 744, the source electrode (or the drain electrode) 742a and the drain electrode (or the source electrode) 742b which are electrically connected to the oxide semiconductor layer 744, the gate insulating layer 746, and the gate electrode 748a. A difference between the transistor 774 and the transistor 773 is that the transistor 774 is provided with a gate insulating layer 747 and a gate electrode 780. That is, in the transistor 774, an electric field can be applied to the oxide semiconductor layer 744 from both above and below. The gate electrode 748a and the gate electrode 780 may be supplied with the same potential. Alternatively, one of these gate electrodes may be supplied with a constant potential. The gate insulating layer 747 can be formed in a manner similar to that of the gate insulating layer 746. The gate electrode 780 can be formed in a manner similar to that of the gate electrode 748a. The other components are the same as those of the transistor 762 in FIGS. 12A and 12B; thus, the description of FIGS. 12A and 12B, FIGS. 13A to 13G, FIGS. 14A to 14E, FIGS. 15A to 15D, FIGS. 16A to 16D, and FIGS. 17A to 17C can be referred to for the details.

Figure 20E:
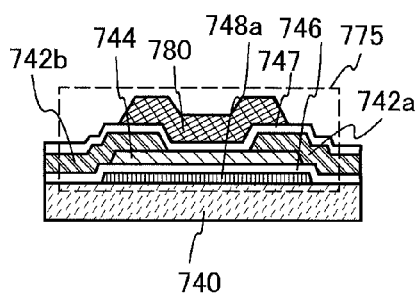

A transistor 775 in FIG. 20E is the same as the transistor 774 in that it includes, over the insulating layer 740, the oxide semiconductor layer 744, the source electrode (or the drain electrode) 742a and the drain electrode (or the source electrode) 742b which are electrically connected to the oxide semiconductor layer 744, the gate insulating layer 746, the gate electrode 748a, the gate insulating layer 747, and the gate electrode 780. A difference between the transistor 774 and the transistor 775 is positions where the oxide semiconductor layer 744 is connected to the source electrode (or the drain electrode) 742a and the drain electrode (or the source electrode) 742b. That is, in the transistor 775, lower portions of the oxide semiconductor layer 744 are in contact with the source electrode (or the drain electrode) 742a and the drain electrode (or the source electrode) 742b. The other components are the same as those of the transistor 762 in FIGS. 12A and 12B; thus, the description of FIGS. 12A and 12B, FIGS. 13A to 13G, FIGS. 14A to 14E, FIGS. 15A to 15D, FIGS. 16A to 16D, and FIGS. 17A to 17C can be referred to for the details.

(Method for Manufacturing SOI Substrate)

Next, an example of a method for manufacturing an SOI substrate used for manufacturing the above semiconductor device will be described with reference to FIGS. 13A to 13G.

Figure 13A:
FIGS. 13A to 13G are cross-sectional views illustrating a manufacturing process of a semiconductor memory device.
Figure 13B:
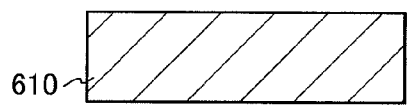

First, the semiconductor substrate 600 is prepared as a base substrate (see FIG. 13A). As the semiconductor substrate 600, a semiconductor substrate such as a single crystal silicon substrate or a single crystal germanium substrate can be used. In addition, as the semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Instead of the semiconductor substrate 600, a variety of glass substrates used in electronic industries, such as a substrate of aluminosilicate glass, aluminoborosilicate glass, or barium borosilicate glass, a quartz substrate, a ceramic substrate, or a sapphire substrate can be used. Further, a ceramic substrate which contains silicon nitride and aluminum nitride as its main components and whose coefficient of thermal expansion is close to that of silicon may be used.

A surface of the semiconductor substrate 600 is preferably cleaned in advance. Specifically, the semiconductor substrate 600 is subjected to cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 610 is used as the bond substrate (see FIG. 13B). Note that although a substrate whose crystallinity is single crystal is used as the bond substrate here, the crystallinity of the bond substrate is not necessarily limited to single crystal.

For example, as the single crystal semiconductor substrate 610, a single crystal semiconductor substrate formed using a Group 14 element, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 610 is not limited to a circular shape, and the single crystal semiconductor substrate 610 may be a substrate which is processed into, for example, a rectangular shape or the like. Further, the single crystal semiconductor substrate 610 can be formed by a Czochralski (CZ) method or a Floating Zone (FZ) method.

Figure 13C:
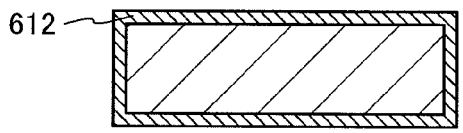

An oxide film 612 is formed on a surface of the single crystal semiconductor substrate 610 (see FIG. 13C). In terms of removal of contamination, it is preferable that the surface of the single crystal semiconductor substrate 610 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 612. Alternatively, diluted hydrofluoric acid and ozone water may be discharged alternately to clean the surface of the single crystal semiconductor substrate 610.

The oxide film 612 can be formed with, for example, a single layer or a stacked layer of a silicon oxide film, a silicon oxynitride film, and the like. As a method for forming the oxide film 612, a thermal oxidation method, a CVD method, a sputtering method, or the like can be used. When the oxide film 612 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 612 (here, a $SiO_x$ film) is formed by performing thermal oxidation treatment on the single crystal semiconductor substrate 610. The thermal oxidation treatment is preferably performed in an oxidizing atmosphere to which a halogen is added.

For example, thermal oxidation treatment is performed on the single crystal semiconductor substrate 610 in an oxidizing atmosphere to which chlorine (Cl) is added, whereby the oxide film 612 can be formed through chlorine oxidation. In this case, the oxide film 612 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 610 can be reduced.

Note that halogen atoms contained in the oxide film 612 are not limited to chlorine atoms. Fluorine atoms may be contained in the oxide film 612. As a method for fluorine oxidation of the surface of the single crystal semiconductor substrate 610, a method in which the single crystal semiconductor substrate 610 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 13D:
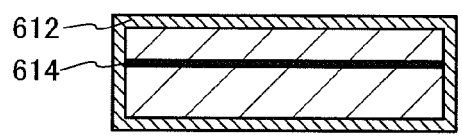
Figure 13E:
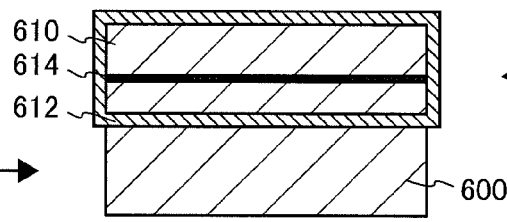

Next, ions are accelerated by an electric field and the single crystal semiconductor substrate 610 is irradiated with the ions, and the ions are added to the single crystal semiconductor substrate 610, whereby an embrittled region 614 where the crystal structure is damaged is formed in the single crystal semiconductor substrate 610 at a predetermined depth (see FIG. 13D).

The depth at which the embrittled region 614 is formed can be adjusted by the kinetic energy, mass, electric charge, or incidence angle of the ions, or the like. The embrittled region 614 is formed at substantially the same depth as the average penetration depth of the ions. Therefore, the thickness of a single crystal semiconductor layer to be separated from the single crystal semiconductor substrate 610 can be adjusted by the depth at which the ions are added. For example, the average penetration depth may be controlled such that the thickness of the single crystal semiconductor layer is approximately 10 nm to 500 nm, preferably, 50 nm to 200 nm.

The above ion irradiation treatment can be performed with the use of an ion doping apparatus or an ion implantation apparatus. As a typical example of the ion doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation type apparatus. In the ion implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 610. A gas containing hydrogen is used as a source gas. As for ions used for the irradiation, the proportion of $H_3^+$ is preferably set high. Specifically, it is preferable that the proportion of $H_3^+$ be greater than or equal to 50% (more preferably, greater than or equal to 80%) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ion, and plural kinds of ions may be added. For example, in the case of performing irradiation with hydrogen and helium concurrently using an ion doping apparatus, the number of steps can be reduced as compared to the case of performing irradiation with hydrogen and helium in different steps, and surface roughness of the single crystal semiconductor layer to be formed later can be suppressed.

Note that heavy metal might be added when the embrittled region 614 is formed with the ion doping apparatus; however, by performing the ion irradiation through the oxide film 612 containing halogen atoms, contamination of the single crystal semiconductor substrate 610 due to the heavy metal can be prevented.

Then, the semiconductor substrate 600 and the single crystal semiconductor substrate 610 are disposed to face each other and are made to be closely attached to each other with the oxide film 612 therebetween. Thus, the semiconductor substrate 600 and the single crystal semiconductor substrate 610 can be bonded to each other (see FIG. 13E). Note that an oxide film or a nitride film may be framed on the surface of the semiconductor substrate 600 to which the single crystal semiconductor substrate 610 is attached.

When bonding is performed, it is preferable that a pressure greater than or equal to 0.001 N/cm$^2$ and less than or equal to 100 N/cm$^2$, e.g., a pressure greater than or equal to 1 N/cm$^2$ and less than or equal to 20 N/cm$^2$, be applied to one part of the semiconductor substrate 600 or one part of the single crystal semiconductor substrate 610. When the bonding surfaces are made close to each other and disposed in close contact with each other by applying a pressure, a bonding between the semiconductor substrate 600 and the oxide film 612 is generated at the part where the close contact is made, and the bonding spontaneously spreads to almost the entire area. This bonding is performed under the action of the Van der Waals force or hydrogen bonding and can be performed at room temperature.

Note that before the single crystal semiconductor substrate 610 and the semiconductor substrate 600 are bonded to each other, surfaces to be bonded to each other are preferably subjected to surface treatment. Surface treatment can improve the bonding strength at the interface between the single crystal semiconductor substrate 610 and the semiconductor substrate 600.

As the surface treatment, wet treatment, dry treatment, or a combination of wet treatment and dry treatment can be used. Alternatively, wet treatment may be performed in combination with different wet treatment or dry treatment may be performed in combination with different dry treatment.

Note that heat treatment for increasing the bonding strength may be performed after bonding. This heat treatment is performed at a temperature at which separation at the embrittled region 614 does not occur (for example, a temperature higher than or equal to room temperature and lower than 400° C.). Alternatively, bonding of the semiconductor substrate 600 and the oxide film 612 may be performed while heating them at a temperature in the above range. The heat treatment can be performed using a diffusion furnace, a heating furnace such as a resistance heating furnace, a rapid thermal annealing (RTA) apparatus, a microwave heating apparatus, or the like. The above temperature condition is merely an example, and one embodiment of the disclosed invention should not be construed as being limited to this example.

Figure 13F:
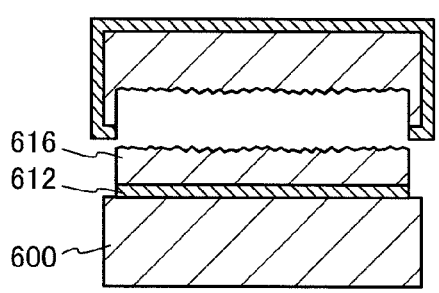

Next, heat treatment is performed for splitting the single crystal semiconductor substrate 610 at the embrittled region, whereby a single crystal semiconductor layer 616 is formed over the semiconductor substrate 600 with the oxide film 612 interposed therebetween (see FIG. 13F).

Note that the temperature for the heat treatment in the separation is desirably as low as possible. This is because as the temperature in the separation is low, generation of roughness on the surface of the single crystal semiconductor layer 616 can be suppressed. Specifically, the temperature for the heat treatment in the separation may be higher than or equal to 300° C. and lower than or equal to 600° C. and the heat treatment is more effective when the temperature is higher than or equal to 400° C. and lower than or equal to 500° C.

Note that after the single crystal semiconductor substrate 610 is split, the single crystal semiconductor layer 616 may be subjected to heat treatment at a temperature higher than or equal to 500° C. so that the concentration of hydrogen remaining in the single crystal semiconductor layer 616 can be reduced.

Figure 13G:
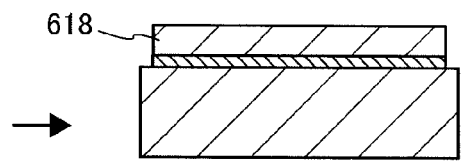

Next, a surface of the single crystal semiconductor layer 616 is irradiated with laser light, whereby a single crystal semiconductor layer 618 in which the flatness of the surface is improved and the number of defects is reduced is formed (see FIG. 13G). Note that instead of the laser light irradiation treatment, heat treatment may be performed.

Although the laser light irradiation treatment is performed immediately after the heat treatment for separation of the single crystal semiconductor layer 616 in this embodiment, one embodiment of the present invention is not construed as being limited to this. Etching treatment may be performed after the heat treatment for separation of the single crystal semiconductor layer 616, to remove a region where there are many defects on the surface of the single crystal semiconductor layer 616, and then the laser light irradiation treatment may be performed. Alternatively, after the surface flatness of the single crystal semiconductor layer 616 is improved, the laser light irradiation treatment may be performed. Note that the etching treatment may be either wet etching or dry etching. Further, in this embodiment, a step of reducing the thickness of the single crystal semiconductor layer 616 may be performed after the laser light irradiation. In order to reduce the thickness of the single crystal semiconductor layer 616, any one of or both dry etching and wet etching may be employed.

Through the above steps, an SOI substrate having the single crystal semiconductor layer 618 with favorable characteristics can be obtained (see FIG. 13G).

(Method for Manufacturing Semiconductor Device)

Next, a method for manufacturing a semiconductor device using the SOI substrate will be described with reference to FIGS. 14A to 14E, FIGS. 15A to 15D, FIGS. 16A to 16D, and FIGS. 17A to 17C.

(Method for Manufacturing Transistor in Lower Portion)

First, a manufacturing method of the transistor 760 in the lower portion will be described with reference to FIGS. 14A to 14E and FIGS. 15A to 15D. Note that FIGS. 14A to 14E and FIGS. 15A to 15D illustrate part of the SOI substrate formed by the method illustrated in FIGS. 13A to 13G, and are cross-sectional views illustrating the steps for manufacturing the transistor in the lower portion illustrated in FIG. 12A.

Figure 14A:
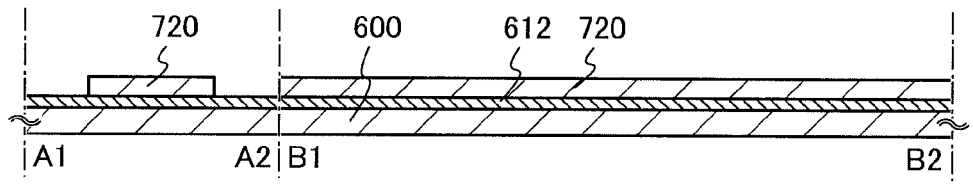
FIGS. 14A to 14E are cross-sectional views illustrating a manufacturing process of a semiconductor memory device.

First, the single crystal semiconductor layer 618 is processed into an island shape, so that a semiconductor layer 720 is formed (see FIG. 14A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as the impurity element imparting n-type conductivity. On the other hand, boron, aluminum, gallium, or the like can be used as the impurity element imparting p-type conductivity.

Figure 14B:
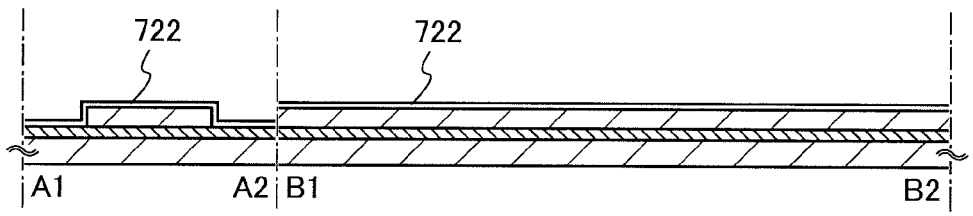

Next, an insulating layer 722 is fainted so as to cover the semiconductor layer 720 (see FIG. 14B). The insulating layer 722 is to be a gate insulating layer later. The insulating layer 722 can be formed, for example, by performing heat treatment (thermal oxidation treatment, thermal nitridation treatment, or the like) on a surface of the semiconductor layer 720. Instead of the heat treatment, high-density plasma treatment may be employed. The high-density plasma treatment can be performed using, for example, a mixed gas of any of a rare gas such as He, Ar, Kr, or Xe, oxygen, nitrogen oxide, ammonia, nitrogen, and hydrogen. Needless to say, the insulating layer may be formed using a CVD method, a sputtering method, or the like. The insulating layer 722 preferably has a single-layer structure or a layered structure including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), and the like. The thickness of the insulating layer 722 may be, for example, greater than or equal to 1 nm and less than or equal to 100 nm, preferably greater than or equal to 10 nm and less than or equal to 50 nm. Here, a single-layer insulating layer containing silicon oxide is formed by a plasma CVD method.

Figure 14C:
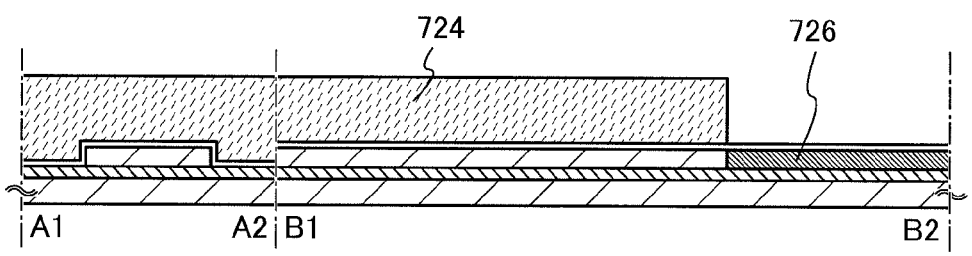

Next, a mask 724 is formed over the insulating layer 722 and the impurity element imparting n-type conductivity is added to the semiconductor layer 720, so that the impurity region 726 is formed (see FIG. 14C). Note that the mask 724 is removed after the impurity element is added.

Figure 14D:
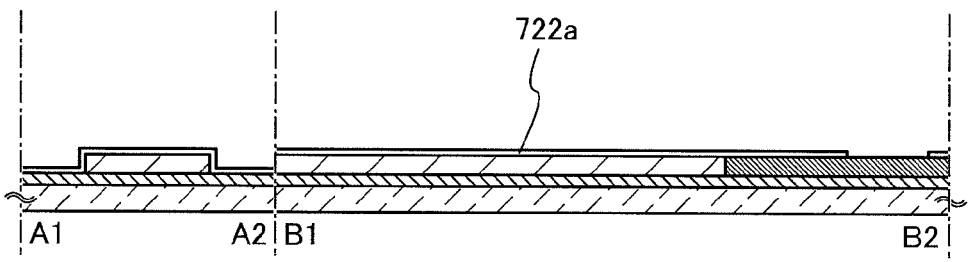

Next, a mask is formed over the insulating layer 722 and a region of the insulating layer 722 that overlaps with the impurity region 726 is partly removed, so that the gate insulating layer 722a is formed (see FIG. 14D). Part of the insulating layer 722 can be removed by etching treatment such as wet etching or dry etching.

Figure 14E:
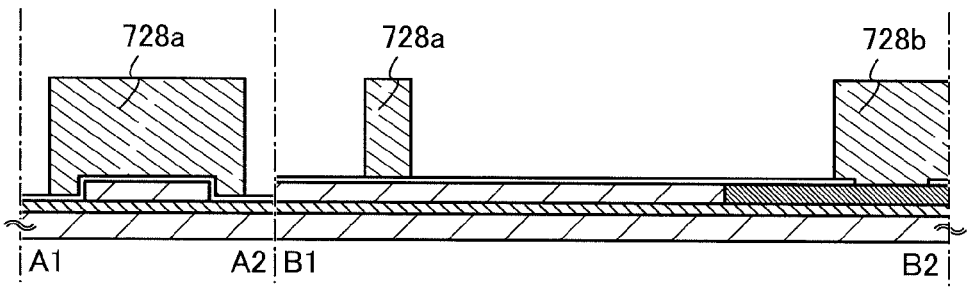

Next, a conductive layer for forming a gate electrode (including a wiring formed using the same layer as the gate electrode) is formed over the gate insulating layer 722a and is processed, so that the gate electrode 728a and the conductive layer 728b are formed (see FIG. 14E).

The conductive layer used for the gate electrode 728a and the conductive layer 728b can be formed using a metal material such as aluminum, copper, titanium, tantalum, or tungsten. Further, the conductive layer may be formed using a semiconductor material such as polycrystalline silicon. There is no particular limitation on the method for forming the conductive layer, and a variety of film formation methods such as an evaporation method, a CVD method, a sputtering method, or a spin coating method can be employed. The conductive layer can be processed by etching using a resist mask.

Figure 15A:
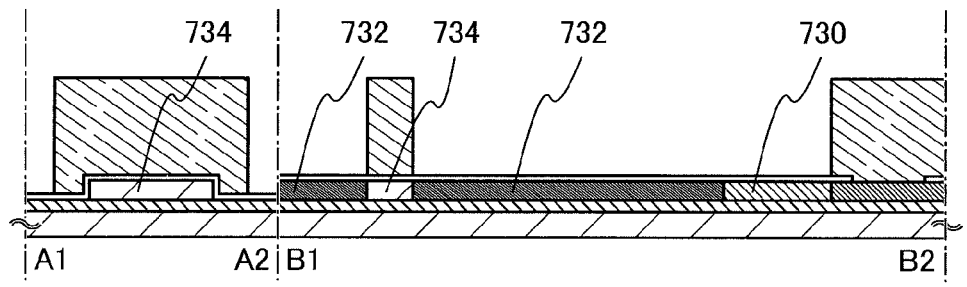
FIGS. 15A to 15D are cross-sectional views illustrating a manufacturing process of a semiconductor memory device.

Next, an impurity element imparting one conductivity type is added to the semiconductor layer with the use of the gate electrode 728a and the conductive layer 728b as masks, so that the channel formation region 734, the impurity regions 732, and the impurity region 730 are formed (see FIG. 15A). Here, in the case of forming an n-channel transistor, an impurity element such as phosphorus (P) or arsenic (As) is added. Here, the concentration of the impurity element to be added can be set as appropriate. In addition, after the impurity element is added, heat treatment for activation is performed. Here, the concentration of the impurity element in the impurity region is increased in the following order: the impurity region 726, the impurity region 732, and the impurity region 730.

Figure 15B:
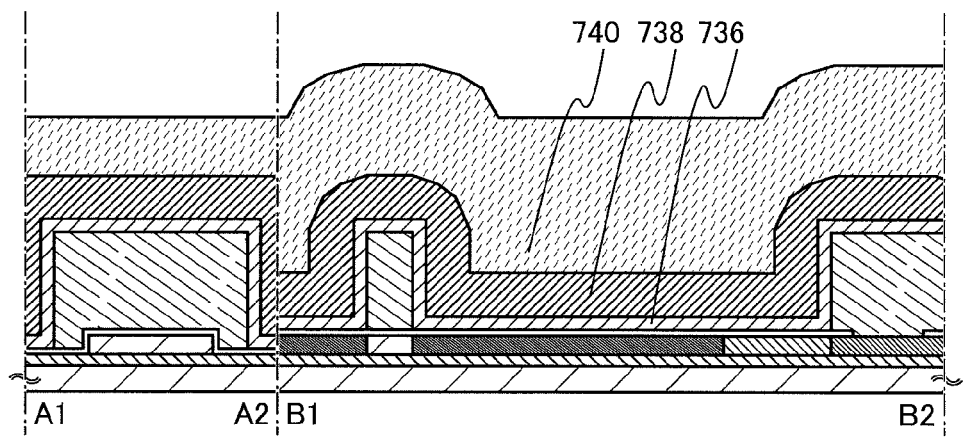

Next, the insulating layer 736, the insulating layer 738, and the insulating layer 740 are formed so as to cover the gate insulating layer 722a, the gate electrode 728a, and the conductive layer 728b (see FIG. 15B).

The insulating layer 736, the insulating layer 738, and the insulating layer 740 can be formed using a material including an inorganic insulating material such as silicon oxide, silicon oxynitride, silicon nitride oxide, silicon nitride, or aluminum oxide. In particular, the insulating layer 736, the insulating layer 738, and the insulating layer 740 are preferably formed using a low permittivity (low-k) material, because capacitance due to overlap of electrodes or wirings can be sufficiently reduced. Note that the insulating layer 736, the insulating layer 738, and the insulating layer 740 may be porous insulating layers formed using any of these materials. Since the porous insulating layer has low permittivity as compared to a dense insulating layer, capacitance due to electrodes or wirings can be further reduced. Alternatively, the insulating layer 736, the insulating layer 738, and the insulating layer 740 can be formed using an organic insulating material such as polyimide or acrylic. In this embodiment, the case of using silicon oxynitride for the insulating layer 736, silicon nitride oxide for the insulating layer 738, and silicon oxide for the insulating layer 740 will be described. A layered structure of the insulating layer 736, the insulating layer 738, and the insulating layer 740 is employed here; however, one embodiment of the disclosed invention is not limited to this. A single-layer structure, a layered structure of two layers, or a layered structure of four or more layers may be used.

Figure 15C:
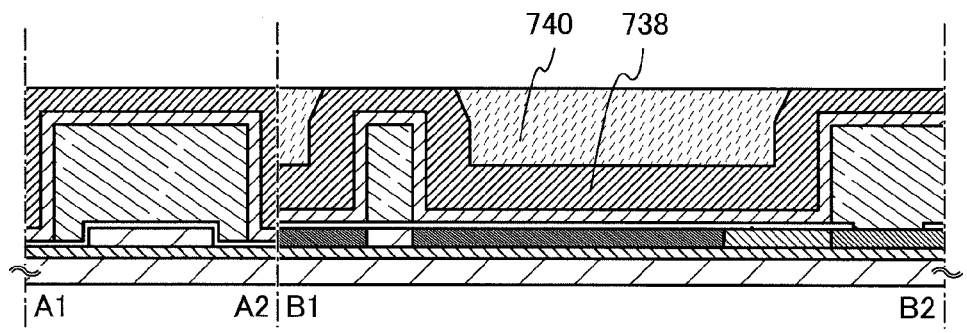

Next, the insulating layer 738 and the insulating layer 740 are subjected to chemical mechanical polishing (CMP) treatment or etching treatment, so that the insulating layer 738 and the insulating layer 740 are flattened (see FIG. 15C). Here, CMP treatment is performed until the insulating layer 738 is partly exposed. When silicon nitride oxide is used for the insulating layer 738 and silicon oxide is used for the insulating layer 740, the insulating layer 738 functions as an etching stopper.

Figure 15D:
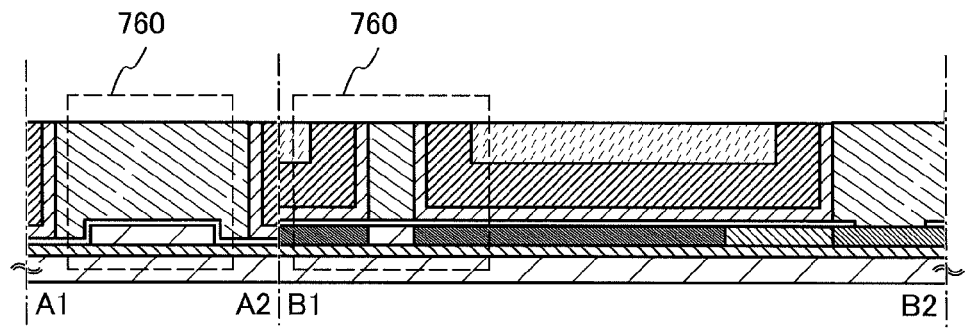

Next, the insulating layer 738 and the insulating layer 740 are subjected to CMP treatment or etching treatment, so that upper surfaces of the gate electrode 728a and the conductive layer 728b are exposed (see FIG. 15D). Here, etching treatment is performed until the gate electrode 728a and the conductive layer 728b are partly exposed. For the etching treatment, dry etching is preferably performed, but wet etching may be performed. In the step of partly exposing the gate electrode 728a and the conductive layer 728b, in order to improve the characteristics of the transistor 762 which is formed later, the surfaces of the insulating layer 736, the insulating layer 738, and the insulating layer 740 are preferably flattened as much as possible.

Through the above steps, the transistor 760 in the lower portion can be formed (see FIG. 15D).

Note that before or after the above steps, a step for forming an additional electrode, wiring, semiconductor layer, or insulating layer may be performed. For example, by employing a multilayer wiring structure in which an insulating layer and a conductive layer are stacked as a wiring structure, a highly integrated semiconductor device can be provided.

(Method for Manufacturing Transistor in Upper Portion)

Next, a method for manufacturing the transistor 762 in the upper portion will be described with reference to FIGS. 16A to 16D and FIGS. 17A to 17C.

Figure 16A:
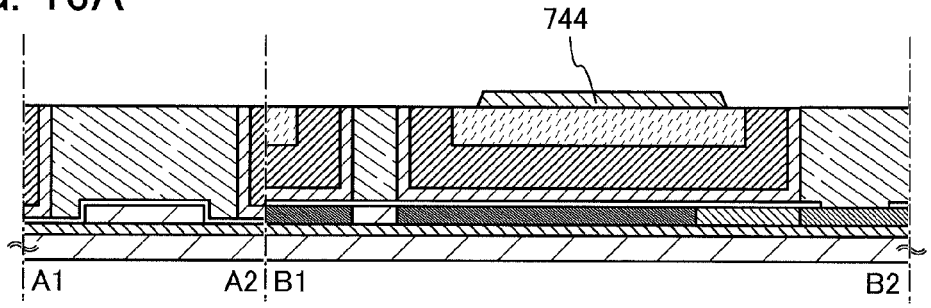
FIGS. 16A to 16D are cross-sectional views illustrating a manufacturing process of a semiconductor memory device.

First, an oxide semiconductor layer is formed over the gate electrode 728a, the conductive layer 728b, the insulating layer 736, the insulating layer 738, the insulating layer 740, and the like and is processed, so that the oxide semiconductor layer 744 is formed (see FIG. 16A). Note that an insulating layer functioning as a base may be formed over the insulating layer 736, the insulating layer 738, and the insulating layer 740 before the oxide semiconductor layer is formed. The insulating layer can be formed by a PVD method such as a sputtering method, a CVD method such as a plasma CVD method, or the like.

As a material used for the oxide semiconductor layer, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like can be used. In addition, the above materials may contain $SiO_2$. Here, for example, an In—Ga—Zn—O-based material means an oxide film including indium (In), gallium (Ga), and zinc (Zn), and there is no particular limitation on the stoichiometric composition thereof. Further, the In—Ga—Zn—O-based oxide semiconductor may contain an element other than In, Ga, and Zn.

As the oxide semiconductor layer, a thin film including a material expressed as the chemical formula, $InMO_3(ZnO)_m$ (m>0), can be used. Here, M represents one or more metal elements selected from Ga, Al, Mn, and Co. For example, M may be Ga, Ga and Al, Ga and Mn, Ga and Co, or the like.

The thickness of the oxide semiconductor layer is preferably greater than or equal to 3 nm and less than or equal to 30 nm. This is because the transistor might be normally on when the oxide semiconductor layer is too thick (e.g., when the thickness is greater than or equal to 50 nm).

The oxide semiconductor layer is preferably formed by a method in which impurities such as hydrogen, water, a hydroxyl group, or hydride do not enter the oxide semiconductor layer. For example, a sputtering method or the like can be used.

In this embodiment, the oxide semiconductor layer is formed by a sputtering method using an In—Ga—Zn—O-based oxide target.

As the In—Ga—Zn—O-based oxide target, for example, an oxide target having a composition ratio of $In_2O_3:Ga_2O_3:ZnO=1:1:1$ [molar ratio] can be used. Note that it is not necessary to limit the material and the composition ratio of the target to the above. For example, an oxide target having a composition ratio of $In_2O_3:Ga_2O_3:ZnO=1:1:2$ [molar ratio] can be used.

The filling rate of the oxide target is greater than or equal to 90% and less than or equal to 100%, preferably greater than or equal to 95% and less than or equal to 99.9%. With the use of the metal oxide target with a high filling rate, a dense oxide semiconductor layer can be formed.

A film formation atmosphere may be a rare gas (typically argon) atmosphere, an oxygen atmosphere, or a mixed atmosphere containing a rare gas and oxygen. An atmosphere of a high-purity gas from which impurities such as hydrogen, water, a hydroxyl group, or hydride are sufficiently removed is preferable, in order to prevent hydrogen, water, a hydroxyl group, hydride, or the like from entering the oxide semiconductor layer.

For example, the oxide semiconductor layer can be formed as follows.

First, the substrate is held in a film formation chamber which is kept under reduced pressure and then is heated so that the substrate temperature reaches a temperature higher than 200° C. and lower than or equal to 500° C., preferably higher than 300° C. and lower than or equal to 500° C., more preferably higher than or equal to 350° C. and lower than or equal to 450° C.

Then, a high-purity gas from which impurities such as hydrogen, water, a hydroxyl group, or hydride are sufficiently removed is introduced into the film formation chamber from which remaining moisture is being removed, and the oxide semiconductor layer is formed over the substrate with the use of the target. To remove moisture remaining in the film formation chamber, an entrapment vacuum pump such as a cryopump, an ion pump, or a titanium sublimation pump is desirably used as an evacuation unit. Further, an evacuation unit may be a turbo pump provided with a cold trap. In the film formation chamber which is evacuated with a cryopump, for example, impurities such as hydrogen, water, a hydroxyl group, or hydride (preferably, also a compound containing a carbon atom) are removed, whereby the concentration of impurities such as hydrogen, water, a hydroxyl group, or hydride in the oxide semiconductor layer formed in the film formation chamber can be reduced.

In the case where the substrate temperature is low (for example, lower than or equal to 100° C.) during film formation, a substance including hydrogen atoms may enter the oxide semiconductor; thus, it is preferable that the substrate be heated at a temperature in the above range. When the oxide semiconductor layer is formed with the substrate heated at the temperature described above, the substrate temperature is increased, so that hydrogen bonds are cut by heat and a substance including hydrogen atoms is less likely to be taken into the oxide semiconductor layer. Therefore, when the oxide semiconductor layer is formed with the substrate heated at the temperature described above, the concentration of impurities such as hydrogen, water, a hydroxyl group, or hydride in the oxide semiconductor layer can be sufficiently reduced. Moreover, damage due to sputtering can be reduced.

As an example of film formation conditions, the following conditions are employed: the distance between the substrate and the target is 60 mm; the pressure is 0.4 Pa; the direct-current (DC) power is 0.5 kW; the substrate temperature is 400° C.; and the film formation atmosphere is an oxygen atmosphere (the proportion of the oxygen flow rate is 100%). Note that a pulse direct current power source is preferable because powder substances (also referred to as particles or dust) generated in film formation can be reduced and the film thickness can be uniform.

Note that before the oxide semiconductor layer is formed by a sputtering method, powdery substances (also referred to as particles or dust) attached to a formation surface of the oxide semiconductor layer are preferably removed by reverse sputtering in which an argon gas is introduced and plasma is generated. The reverse sputtering refers to a method in which voltage is applied to a substrate to generate plasma in the vicinity of the substrate to modify a surface on the substrate side. Note that instead of argon, a gas of nitrogen, helium, oxygen, or the like may be used.

The oxide semiconductor layer can be processed through the steps of forming a mask having a desired shape over the oxide semiconductor layer and etching the oxide semiconductor layer. The mask may be formed by a method such as photolithography. Alternatively, a method such as an inkjet method may be used to form the mask. For the etching of the oxide semiconductor layer, either wet etching or dry etching may be employed. It is needless to say that both of them may be employed in combination.

After that, heat treatment (first heat treatment) may be performed on the oxide semiconductor layer 744. The heat treatment eliminates substances including hydrogen atoms in the oxide semiconductor layer 744; thus, a structure of the oxide semiconductor layer 744 can be ordered and defect levels in energy gap can be reduced. The heat treatment is performed in an inert gas atmosphere at a temperature higher than or equal to 250° C. and lower than or equal to 700° C., preferably higher than or equal to 450° C. and lower than or equal to 600° C. or lower than the strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is set to 6 N (99.9999%) or more, preferably 7 N (99.99999%) or more (that is, the concentration of the impurities is less than or equal to 1 ppm, preferably less than or equal to 0.1 ppm).

The heat treatment can be performed in such a way that, for example, an object to be processed is introduced into an electric furnace in which a resistance heating element or the like is used and heated in a nitrogen atmosphere at 450° C. for one hour. The oxide semiconductor layer 744 is not exposed to the air during the heat treatment so that entry of water and hydrogen can be prevented.

The impurities are reduced by the heat treatment so that the i-type (intrinsic) or substantially i-type oxide semiconductor layer is obtained. Accordingly, a transistor having significantly excellent characteristics can be realized.

The above heat treatment has an effect of removing hydrogen, water, and the like and can be referred to as dehydration treatment, dehydrogenation treatment, or the like. The heat treatment can be performed, for example, before the oxide semiconductor layer is processed into an island shape or after the gate insulating film is formed. Such dehydration treatment or dehydrogenation treatment may be performed once or plural times.

Figure 16B:
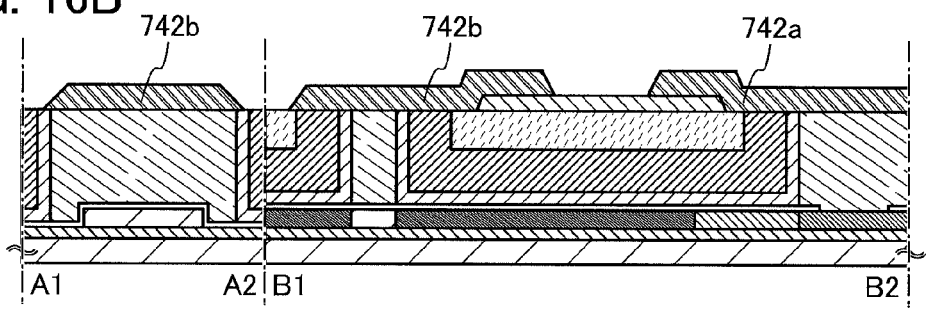

Next, a conductive layer for forming a source electrode and a drain electrode (including a wiring formed using the same layer as the source electrode and the drain electrode) is formed over the oxide semiconductor layer 744 and the like and is processed, so that the source electrode 742a and the drain electrode 742b are formed (see FIG. 16B).

The conductive layer can be formed by a PVD method or a CVD method. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked. Note that the conductive layer having a single-layer structure of a titanium film or a titanium nitride film has an advantage in that it can be easily processed into the source electrode 742a and the drain electrode 742b each having a tapered shape.

Alternatively, the conductive layer may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), an alloy of indium oxide and zinc oxide ($In_2O_3$—ZnO), or any of these metal oxide materials in which silicon or silicon oxide is contained can be used.

The conductive layer is preferably etched so that end portions of the source electrode 742a and the drain electrode 742b that are to be formed are tapered. Here, a taper angle is, for example, preferably greater than or equal to 30° and less than or equal to 60°. The etching is performed so that the end portions of the source electrode 742a and the drain electrode 742b are tapered, whereby coverage with the gate insulating layer 746 formed later can be improved and disconnection can be prevented.

The channel length (L) of the transistor in the upper portion is determined by a distance between lower end portions of the source electrode 742a and the drain electrode 742b. Note that for light exposure for forming a mask used in the case where a transistor with a channel length (L) of less than 25 nm is formed, it is preferable to use extreme ultraviolet light whose wavelength is as short as several nanometers to several tens of nanometers. In the light exposure by extreme ultraviolet light, the resolution is high and the focus depth is large. For these reasons, the channel length (L) of the transistor to be formed later can be in the range of 10 nm to 1000 nm (1 μm), and the circuit can operate at higher speed. Moreover, miniaturization can lead to lower power consumption of the semiconductor memory device.

As an example which is different from that in FIG. 16B, oxide conductive layers can be provided as a source region and a drain region, between the oxide semiconductor layer 744 and the source and drain electrodes. A material of the oxide conductive layer preferably contains zinc oxide as its component and preferably does not contain indium oxide. For such an oxide conductive layer, zinc oxide, zinc aluminum oxide, zinc aluminum oxynitride, zinc gallium oxide, or the like can be used.

For example, the oxide conductive layers which serve as a source region and a drain region, the source electrode 742a, and the drain electrode 742b can be formed by forming an oxide conductive film over the oxide semiconductor layer 744, forming a conductive layer over the oxide conductive film, and processing the oxide conductive film and the conductive layer in one photolithography step.

Alternatively, a stacked layer of an oxide semiconductor film and an oxide conductive film is formed and the stacked layer is processed in one photolithography step, so that the island-shaped oxide semiconductor layer 744 and oxide conductive film may be formed. After the source electrode 742a and the drain electrode 742b are formed, the island-shaped oxide conductive film is etched using the source electrode 742a and the drain electrode 742b as masks, so that the oxide conductive layers which serve as a source region and a drain region can be formed.

Note that when etching treatment for processing the oxide conductive layer is performed, etching conditions (e.g., type of etchant, the concentration of an etchant, and etching time) are adjusted as appropriate in order to prevent excessive etching of the oxide semiconductor layer.

When oxide conductive layers are provided between the oxide semiconductor layer and the source and drain electrodes, a source region and a drain region can have lower resistance and the transistor can operate at high speed. With the structure including the oxide semiconductor layer 744, the oxide conductive layer, and the drain electrode formed using a metal material, withstand voltage of the transistor can be further increased.

It is effective to use the oxide conductive layers for the source region and the drain region in order to improve frequency characteristics of a peripheral circuit (a driver circuit). The contact resistance can be reduced when a metal electrode (e.g., molybdenum or tungsten) and the oxide conductive layer are in contact with each other, as compared to the case where a metal electrode (e.g., molybdenum or tungsten) and the oxide semiconductor layer are in contact with each other. The contact resistance can be reduced by interposing the oxide conductive layers between the oxide semiconductor layer and the source and drain electrode layers; accordingly, frequency characteristics of a peripheral circuit (a driver circuit) can be improved.

Figure 16C:
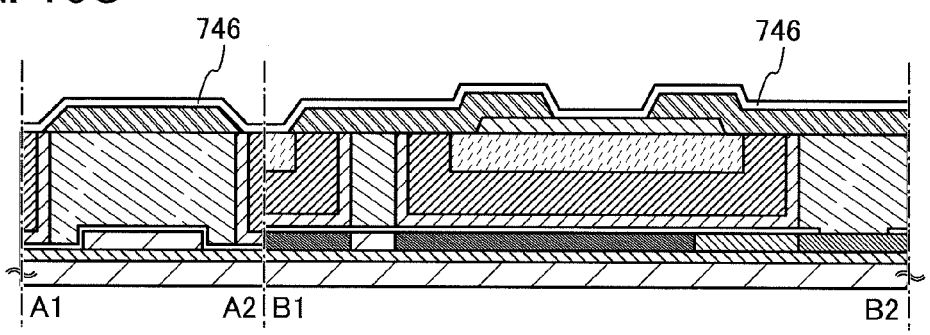

Next, the gate insulating layer 746 is formed so as to cover the source electrode 742a and the drain electrode 742b and to be in contact with part of the oxide semiconductor layer 744 (see FIG. 16C).

The gate insulating layer 746 can be formed by a CVD method, a sputtering method, or the like. The gate insulating layer 746 is preferably formed to contain silicon oxide, silicon nitride, silicon oxynitride, gallium oxide, aluminum oxide, tantalum oxide, hafnium oxide, yttrium oxide, hafnium silicate (HfSi$_x$O$_y$, (x>0, y>0)), hafnium silicate to which nitrogen is added (HfSi$_x$O$_y$N$_z$, (x>0, y>0, z>0)), hafnium aluminate to which nitrogen is added (HfAl$_x$O$_y$N$_z$ (x>0, y>0, z>0)), or the like. The gate insulating layer 746 may have a single-layer structure or a layered structure in which these materials are combined. There is no particular limitation on the thickness; however, in the case where the semiconductor memory device is miniaturized, the thickness is preferably small for ensuring operation of the transistor. For example, in the case where silicon oxide is used, the thickness can be greater than or equal to 1 nm and less than or equal to 100 nm, preferably greater than or equal to 10 nm and less than or equal to 50 nm.

When the gate insulating layer is thin as in the above description, a problem of gate leakage current due to a tunneling effect or the like is caused. In order to solve the problem of gate leakage current, a high permittivity (high-k) material such as hafnium oxide, tantalum oxide, yttrium oxide, hafnium silicate (HfSi$_x$O$_y$, (x>0, y>0)), hafnium silicate to which nitrogen is added (HfSi$_x$O$_y$, (x>0, y>0), or hafnium aluminate to which nitrogen is added (HfAl$_x$O$_y$, (x>0, y>0) is preferably used for the gate insulating layer 746. By using a high-k material for the gate insulating layer 746, electrical characteristics can be ensured and the thickness can be large to prevent gate leakage current. Note that a layered structure of a film containing a high-k material and a film containing any one of silicon oxide, silicon nitride, silicon oxynitride, silicon nitride oxide, aluminum oxide, and the like may be employed.

Further, the insulating layer in contact with the oxide semiconductor layer 744 (in this embodiment, the gate insulating layer 746) may be formed using an insulating material containing a Group 13 element and oxygen. Many oxide semiconductor materials contain a Group 13 element, and thus, an insulating material containing a Group 13 element works well with the oxide semiconductor. By using such an insulating material for the insulating layer in contact with the oxide semiconductor, an interface with the oxide semiconductor can be kept in a favorable state.

Here, an insulating material containing a Group 13 element means an insulating material containing one or more Group 13 elements. As an insulating material containing a Group 13 element, gallium oxide, aluminum oxide, aluminum gallium oxide, gallium aluminum oxide, and the like are given. Here, aluminum gallium oxide is a material in which the amount of aluminum is larger than that of gallium in atomic percent, and gallium aluminum oxide is a material in which the amount of gallium is larger than that of aluminum in atomic percent.

For example, in the case of forming a gate insulating layer in contact with an oxide semiconductor layer containing gallium, a material containing gallium oxide may be used as the gate insulating layer, so that favorable characteristics can be maintained at the interface between the oxide semiconductor layer and the gate insulating layer. When the oxide semiconductor layer and the insulating layer containing gallium oxide are provided in contact with each other, pileup of hydrogen at the interface between the oxide semiconductor layer and the insulating layer can be reduced. Note that a similar effect can be obtained in the case where an element belonging to the same group as a constituent element of the oxide semiconductor is used for the insulating layer. For example, it is also effective to form an insulating layer with the use of a material containing aluminum oxide. Aluminum oxide has a property of not easily transmitting water. Thus, it is preferable to use the material containing aluminum oxide in terms of preventing entry of water into the oxide semiconductor layer.

The insulating layer in contact with the oxide semiconductor layer 744 preferably contains oxygen with a proportion higher than that in the stoichiometric composition by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 744 is formed of gallium oxide, the composition of gallium oxide can be set to be Ga$_2$O$_x$ (x=3+α, 0<α<1) by heat treatment in an oxygen atmosphere or oxygen doping. In the case where the insulating layer in contact with the oxide semiconductor layer 744 is formed of aluminum oxide, the composition of aluminum oxide can be set to be Al$_2$O$_x$ (x=3+α, 0<α<1) by heat treatment in an oxygen atmosphere or oxygen doping. In the case where the insulating layer in contact with the oxide semiconductor layer 744 is formed of gallium aluminum oxide (aluminum gallium oxide), the composition of gallium aluminum oxide (aluminum gallium oxide) can be set to be Ga$_x$Al$_{2-x}$O$_{3+α}$ (0<x<2, 0<α<1) by heat treatment in an oxygen atmosphere or oxygen doping.

By oxygen doping or the like, an insulating layer including a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer or at the interface between the oxide semiconductor layer and the insulating layer is reduced. Thus, the oxide semiconductor layer can be an i-type or substantially i-type oxide semiconductor.

The insulating layer including a region where the proportion of oxygen is higher than that in the stoichiometric composition may be applied to an insulating layer serving as a base film of the oxide semiconductor layer 744 instead of the gate insulating layer 746, or both the gate insulating layer 746 and the base insulating layer.

After the gate insulating layer 746 is formed, second heat treatment is desirably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for one hour in a nitrogen atmosphere. The second heat treatment can reduce variation in electrical characteristics of the transistor. Moreover, in the case where the gate insulating layer 746 includes oxygen, oxygen can be supplied to the oxide semiconductor layer 744 and oxygen deficiency in the oxide semiconductor layer 744 can be filled; thus, an i-type (intrinsic) or substantially i-type oxide semiconductor layer can be formed.

Note that in this embodiment, the second heat treatment is performed after the gate insulating layer 746 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, by employing at least one of the first heat treatment and the second heat treatment, the oxide semiconductor layer 744 can be highly purified so as to contain the substance including hydrogen atoms as little as possible.

Figure 16D:
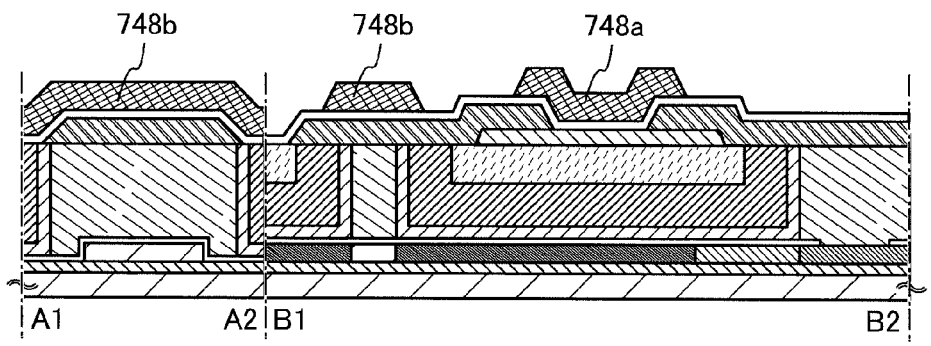

Next, a conductive layer for forming a gate electrode (including a wiring formed using the same layer as the gate electrode) is formed and is processed, so that the gate electrode 748a and the conductive layer 748b are formed (see FIG. 16D).

The gate electrode 748a and the conductive layer 748b can be formed using a metal material such as molybdenum, titanium, tantalum, tungsten, aluminum, copper, neodymium, or scandium, or an alloy material containing any of these materials as its main component. Note that the gate electrode 748a and the conductive layer 748b may have a single-layer structure or a layered structure.

Figure 17A:
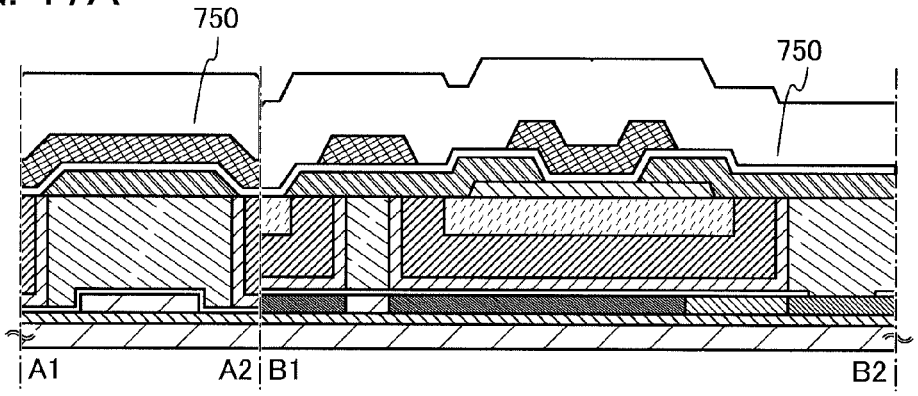
FIGS. 17A to 17C are cross-sectional views illustrating a manufacturing process of a semiconductor memory device.
Figure 17B:
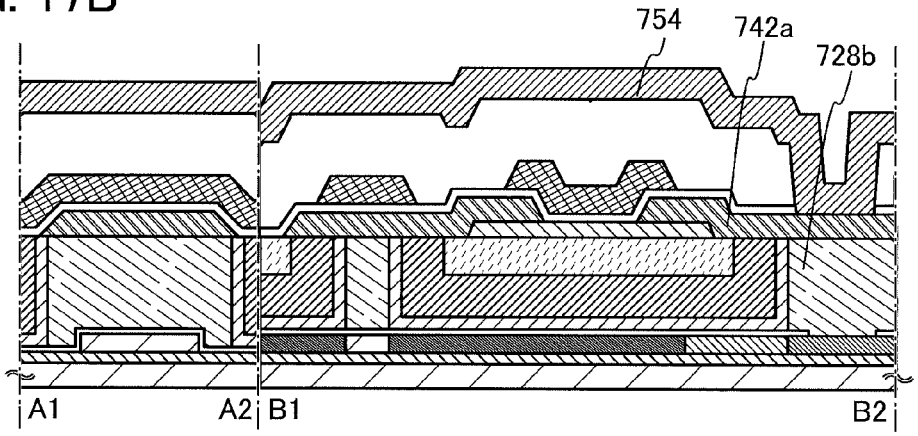

Next, the insulating layer 750 is formed over the gate insulating layer 746, the gate electrode 748a, and the conductive layer 748b (see FIG. 17A). The insulating layer 750 can be formed by a PVD method, a CVD method, or the like. The insulating layer 750 can be formed using a material including an inorganic insulating material such as silicon oxide, silicon oxynitride, silicon nitride, hafnium oxide, gallium oxide, or aluminum oxide. Note that for the insulating layer 750, a material with a low permittivity may be preferably used or a structure with a low permittivity (e.g., a porous structure) may be preferably employed. This is because by reducing the permittivity of the insulating layer 750, capacitance between wirings and electrodes can be reduced, which will increase operation speed. Note that although the insulating layer 750 has a single-layer structure in this embodiment, one embodiment of the disclosed invention is not limited to this. The insulating layer 750 may have a layered structure including two or more layers.

Next, an opening reaching the source electrode 742a is formed in the gate insulating layer 746 and the insulating layer 750. Then, the wiring 754 in contact with the source electrode 742a is formed over the insulating layer 750 (see FIG. 17B). The opening is formed by selective etching using a mask or the like.

A conductive layer is formed by a PVD method or a CVD method and then is patterned, so that the wiring 754 is formed. As a material for the conductive layer, an element selected from aluminum, chromium, copper, tantalum, titanium, molybdenum, and tungsten; an alloy containing any of these elements as its component; or the like can be used. Further, one or more materials selected from manganese, magnesium, zirconium, beryllium, neodymium, and scandium may be used.

Specifically, it is possible to employ a method, for example, in which after a thin titanium film (about 5 nm) is formed in a region including the opening of the insulating layer 750 by a PVD method, an aluminum film is formed so as to fill the opening. Here, the titanium film formed by a PVD method has a function of reducing an oxide film (e.g., a natural oxide film) formed on a surface where the titanium film is formed, to decrease contact resistance with a lower electrode (here, the source electrode 742a). In addition, hillock of the aluminum film can be prevented. A copper film may be formed by a plating method after the formation of the barrier film of titanium, titanium nitride, or the like.

The opening formed in the insulating layer 750 is preferably formed in a region overlapping with the conductive layer 728b. The opening is formed in such a region, whereby an increase in the element area due to a contact region can be suppressed.

A position where the impurity region 726 and the source electrode 742a are connected and a position where the source electrode 742a and the wiring 754 are connected may overlap with each other without using the conductive layer 728b; such a case will be described. In that case, an opening (also referred to as a contact in a lower portion) is formed in the insulating layer 736, the insulating layer 738, and the insulating layer 740 that are formed over the impurity region 726, and the source electrode 742a is formed in the contact in the lower portion. After that, an opening (also referred to as a contact in an upper portion) is formed in a region overlapping with the contact in the lower portion in the gate insulating layer 746 and the insulating layer 750, and then the wiring 754 is formed. When the contact in the upper portion is formed in the region overlapping with the contact in the lower portion, the source electrode 742a formed in the contact in the lower portion might be disconnected by etching. In order to avoid the disconnection, the contact in the lower portion and the contact in the upper portion may be formed so as not to overlap with each other, but a problem of the increase in the element area occurs.

As described in this embodiment, with the use of the conductive layer 728b, the contact in the upper portion can be formed without disconnection of the source electrode 742a. Thus, the contact in the lower portion and the contact in the upper portion can be formed so as to overlap with each other, so that the increase in the element area due to the contact regions can be suppressed. In other words, the degree of integration of the semiconductor memory device can be increased.

Figure 17C:
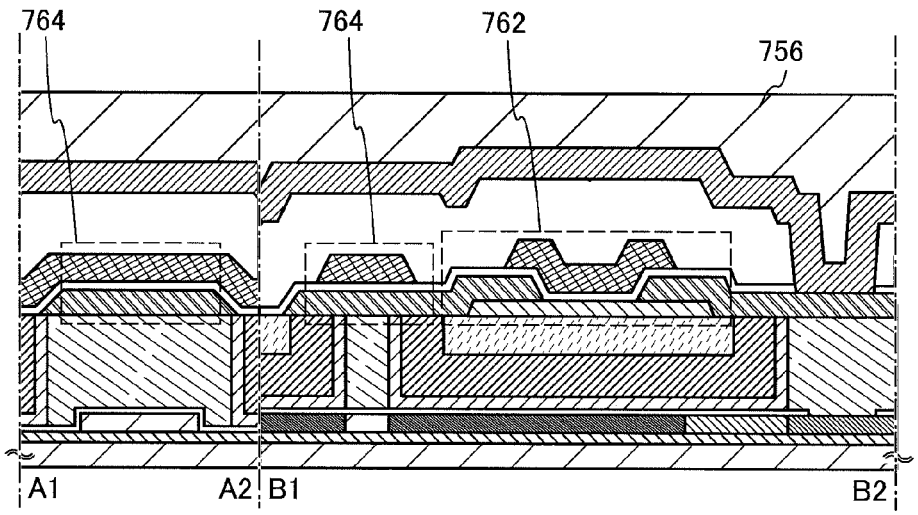

Next, the insulating layer 756 is formed so as to cover the wiring 754 (see FIG. 17C).

Through the above process, the capacitor 764 and the transistor 762 including the highly purified oxide semiconductor layer 744 are completed (see FIG. 17C).

Since the oxide semiconductor layer 744 is a highly purified oxide semiconductor layer in the transistor 762 described in this embodiment, the hydrogen concentration is less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. In addition, the value of the carrier density of the oxide semiconductor layer 744 is sufficiently low (e.g., less than $1 \times 10^{12}$/cm$^3$, preferably less than $1.45 \times 10^{10}$/cm$^3$) as compared with that of a general silicon wafer (approximately $1 \times 10^{14}$/cm$^3$). Accordingly, the off-state current is also sufficiently small. For example, the off-state current (here, current per micrometer (µm) of channel width) of the transistor 762 at room temperature (25° C.) is less than or equal to 100 zA (1 zA (zeptoampere) is $1 \times 10^{-21}$ A), preferably less than or equal to 10 zA.

With the use of the highly purified intrinsic oxide semiconductor layer 744, the off-state current of the transistor can be sufficiently reduced easily. By using such a transistor, a semiconductor memory device in which stored data can be held for an extremely long time can be obtained.

In addition, in the semiconductor memory device described in this embodiment, a wiring can be shared; thus, a semiconductor memory device with sufficiently increased degree of integration can be realized.

The structures, the methods, and the like described in this embodiment can be combined as appropriate with any of the structures, the methods, and the like described in the other embodiments.

Embodiment 7

In this embodiment, an application example of a semiconductor device including the semiconductor memory device described in any of the above embodiments will be described with reference to drawings.

A semiconductor memory device of the present invention can be used for electronic devices provided with a memory in various fields. For example, as electronic devices to which the semiconductor memory device of the present invention is applied, a camera such as a video camera or a digital camera, a goggle-type display (head-mounted display), a navigation system, a sound reproducing device (e.g., a car audio device or an audio component), a computer, a game machine, a portable information terminal (e.g., a mobile computer, a mobile phone, a portable game machine, or an electronic book reader), an image reproducing device which includes a recording medium (specifically, a device which reproduces a recording medium, such as a DVD (digital versatile disc), and has a display which can display the images), and the like can be given. Specific examples of such electronic devices are illustrated in FIGS. 18A to 18E.

Figure 18A:
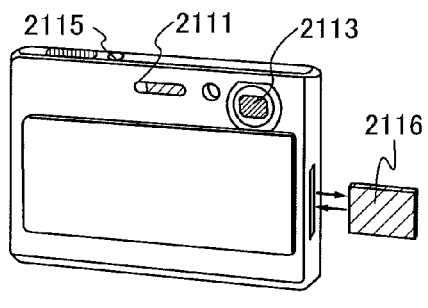
FIGS. 18A to 18E illustrate electronic devices.
Figure 18B:
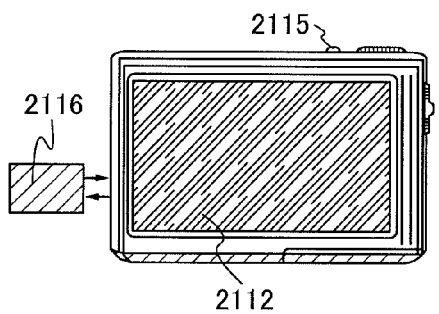

FIGS. 18A and 18B illustrate a digital camera. FIG. 18B shows the rear side of FIG. 18A. The digital camera includes a housing 2111, a display portion 2112, a lens 2113, a shutter button 2115, and the like. Further, the digital camera includes a removable memory 2116, in which data taken with the digital camera is stored. A semiconductor memory device formed using the present invention can be applied to the memory 2116.

Figure 18C:
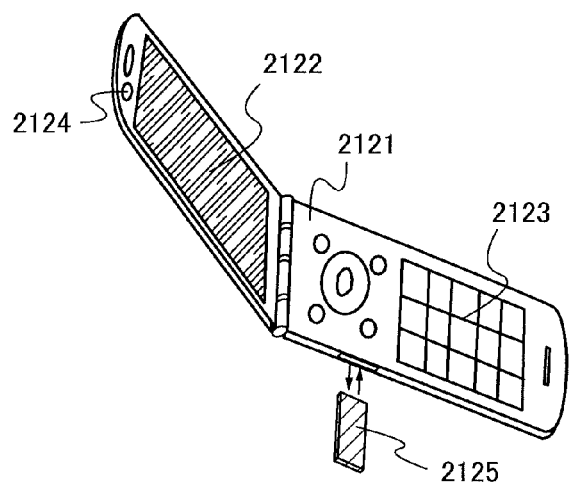

FIG. 18C illustrates a mobile phone, which is a typical example of a portable terminal. The mobile phone includes a housing 2121, a display portion 2122, operating keys 2123, a camera lens 2124, and the like. Further, the mobile phone includes a removable memory 2125. Data such as telephone number of the mobile phone, images, music data, and the like can be stored in the memory 2125 and reproduced. A semiconductor memory device formed using the present invention can be applied to the memory 2125.

Figure 18D:
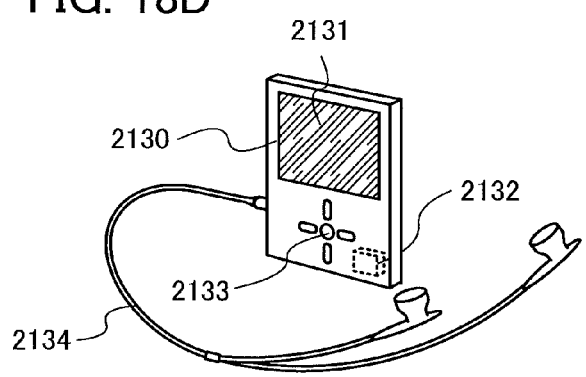

Further, FIG. 18D illustrates a digital player, which is a typical example of an audio device. The digital player illustrated in FIG. 18D includes a main body 2130, a display portion 2131, a memory portion 2132, an operating portion 2133, earphones 2134, and the like. Note that headphones or wireless earphones can be used instead of the earphones 2134. A semiconductor memory device formed using the present invention can be used for the memory portion 2132. For example, a NAND-type memory with a memory capacity of 20 gigabytes (GB) to 200 gigabytes (GB) can be used. In addition, when the operating portion 2133 is operated, images and sound (e.g., music) can be stored and reproduced. Note that a semiconductor memory device which is provided in the memory portion 2132 may be removable.

Figure 18E:
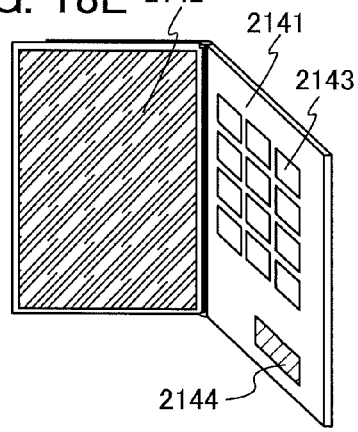

FIG. 18E illustrates an electronic book reader (also referred to as electronic paper). This electronic book reader includes a main body 2141, a display portion 2142, operation keys 2143, and a memory portion 2144. A modem may be built into the main body 2141, or a structure in which data can be transmitted and received wirelessly may be employed. A semiconductor memory device formed using the present invention can be used for the memory portion 2144. For example, a NAND-type memory with a memory capacity of 20 gigabytes (GB) to 200 gigabytes (GB) can be used. In addition, when the operation keys 2143 are operated, images and sound (e.g., music) can be stored and reproduced. Note that a semiconductor memory device which is provided in the memory portion 2144 may be removable.

As described above, the application range of a semiconductor memory device of the present invention is so wide that the semiconductor memory device can be applied to electronic devices provided with a memory in various fields.

This application is based on Japanese Patent Application serial no. 2010-204405 filed with Japan Patent Office on Sep. 13, 2010, the entire contents of which are hereby incorporated by reference.

What is claimed is:

1. A semiconductor memory device comprising:
   a memory cell unit comprising a plurality of memory elements;
   a first transistor comprising a first terminal, a second terminal, and a gate;
   an inverted data output circuit comprising an input terminal and an output terminal, wherein the input terminal is electrically connected to the first terminal of the first transistor and the output terminal is electrically connected to the memory cell unit and the second terminal of the first transistor; and
   a capacitor electrically connected to the input terminal of the inverted data output circuit and the first terminal of the first transistor.

2. The semiconductor memory device according to claim 1, further comprising a second transistor comprising a fifth terminal, a sixth terminal, and a third gate, wherein the fifth terminal is electrically connected to the first terminal of the first transistor, the input terminal of the inverted data output circuit, and a seventh terminal of the capacitor and the sixth terminal is electrically connected to an eighth terminal of the capacitor.

3. The semiconductor memory device according to claim 1, further comprising a second transistor electrically connected to the memory cell unit.

4. The semiconductor memory device according to claim 1, further comprising a second transistor comprising a fifth terminal, a sixth terminal, and a third gate, wherein the fifth terminal is electrically connected to the memory cell unit and the sixth terminal is electrically connected to the second terminal of the first transistor and the output terminal of the inverted data output circuit.

5. The semiconductor memory device according to claim 1, further comprising:
   a second transistor comprising a fifth terminal, a sixth terminal, and a third gate, wherein the fifth terminal is electrically connected to the memory cell unit, the second terminal of the first transistor, and the output terminal of the inverted data output circuit;
   a data signal line electrically connected to the sixth terminal of the second transistor; and
   a column gate control line electrically connected to the third gate of the second transistor.

6. The semiconductor memory device according to claim 1, wherein the first transistor comprises oxide semiconductor.

7. An electronic device comprising the semiconductor memory device according to claim 1, wherein the electronic device is one selected from the group consisting of a camera, a goggle-type display, a navigation system, a sound reproducing device, a computer, a game machine, a portable information terminal, and an image reproducing device.

8. A semiconductor memory device comprising:
a memory cell unit comprising a plurality of memory elements;
a first transistor comprising a first terminal, a second terminal, and a gate;
an inverted data output circuit comprising a three-state inverter circuit comprising an input terminal and an output terminal, wherein the input terminal is electrically connected to the first terminal of the first transistor and the output terminal is electrically connected to the memory cell unit and the second terminal of the first transistor; and
a capacitor electrically connected to the input terminal of the three-state inverter circuit and the first terminal of the first transistor.

9. The semiconductor memory device according to claim 8, wherein the three-state inverter circuit comprises a second transistor, a third transistor, a fourth transistor, and a fifth transistor electrically connected in series between two wirings, wherein the input terminal of the three-state inverter circuit is electrically connected to a gate of the third transistor and a gate of the fourth transistor, and wherein the output terminal of the three-state inverter circuit is electrically connected to one terminal of the third transistor and one terminal of the fourth transistor.

10. The semiconductor memory device according to claim 8, further comprising a third transistor comprising a fifth terminal, a sixth terminal, and a third gate, wherein the fifth terminal is electrically connected to the first terminal of the first transistor, the input terminal of the three-state inverter circuit, and a seventh terminal of the capacitor and the sixth terminal is electrically connected to an eighth terminal of the capacitor.

11. The semiconductor memory device according to claim 8, further comprising a third transistor electrically connected to the memory cell unit.

12. The semiconductor memory device according to claim 8, further comprising a third transistor comprising a fifth terminal, a sixth terminal, and a third gate, wherein the fifth terminal is electrically connected to the memory cell unit and the sixth terminal is electrically connected to the second terminal of the first transistor and the output terminal of the three-state inverter circuit.

13. The semiconductor memory device according to claim 8, further comprising:
a third transistor comprising a fifth terminal, a sixth terminal, and a third gate,
wherein the fifth terminal is electrically connected to the memory cell unit, the second terminal of the first transistor, and the output terminal of the three-state inverter circuit;
a data signal line electrically connected to the sixth terminal of the third transistor; and
a column gate control line electrically connected to the third gate of the third transistor.

14. The semiconductor memory device according to claim 8, wherein the first transistor comprises oxide semiconductor.

15. An electronic device comprising the semiconductor memory device according to claim 8, wherein the electronic device is one selected from the group consisting of a camera, a goggle-type display, a navigation system, a sound reproducing device, a computer, a game machine, a portable information terminal, and an image reproducing device.

16. A semiconductor memory device comprising:
a memory cell unit comprising a plurality of memory elements;
a first transistor comprising a first terminal, a second terminal, and a first gate;
an inverted data output circuit comprising:
an inverter comprising an input terminal and an output terminal,
wherein the input terminal is electrically connected to the first terminal of the first transistor; and
a second transistor comprising a third terminal, a fourth terminal, and
a second gate, wherein the third terminal is electrically connected to the output terminal of the inverter and the fourth terminal is electrically connected to the memory cell unit and the second terminal of the first transistor; and
a capacitor electrically connected to the input terminal of the inverter and the first terminal of the first transistor.

17. The semiconductor memory device according to claim 16, further comprising a third transistor comprising a fifth terminal, a sixth terminal, and a third gate, wherein the fifth terminal is electrically connected to the first terminal of the first transistor, the input terminal of the inverter, and a seventh terminal of the capacitor and the sixth terminal is electrically connected to an eighth terminal of the capacitor.

18. The semiconductor memory device according to claim 16, further comprising a third transistor electrically connected to the memory cell unit.

19. The semiconductor memory device according to claim 16, further comprising a third transistor comprising a fifth terminal, a sixth terminal, and a third gate, wherein the fifth terminal is electrically connected to the memory cell unit and the sixth terminal is electrically connected to the second terminal of the first transistor and the fourth terminal of the second transistor.

20. The semiconductor memory device according to claim 16, further comprising:
a third transistor comprising a fifth terminal, a sixth terminal, and a third gate,
wherein the fifth terminal is electrically connected to the memory cell unit, the second terminal of the first transistor, and the fourth terminal of the second transistor;
a data signal line electrically connected to the sixth terminal of the third transistor; and
a column gate control line electrically connected to the third gate of the third transistor.

21. The semiconductor memory device according to claim 16, wherein the first transistor comprises oxide semiconductor.

22. An electronic device comprising the semiconductor memory device according to claim 16, wherein the electronic device is one selected from the group consisting of a camera, a goggle-type display, a navigation system, a sound reproducing device, a computer, a game machine, a portable information terminal, and an image reproducing device.

* * * * *

UNITED STATES PATENT AND TRADEMARK OFFICE
CERTIFICATE OF CORRECTION

| | | |
|---|---|---|
| PATENT NO. | : 8,750,023 B2 | Page 1 of 1 |
| APPLICATION NO. | : 13/230122 | |
| DATED | : June 10, 2014 | |
| INVENTOR(S) | : Kazuma Furutani et al. | |

It is certified that error appears in the above-identified patent and that said Letters Patent is hereby corrected as shown below:

In the Specification

Column 13, line 67, replace "faulted" with --formed--;

Column 20, line 2, after "13G" insert --,--;

Column 27, line 5, replace "framed" with --formed--; and

Column 28, line 58, replace "fainted" with --formed--.

Signed and Sealed this
Twentieth Day of January, 2015

Michelle K. Lee
*Deputy Director of the United States Patent and Trademark Office*